US010381516B2

(12) United States Patent
Wakai et al.

(10) Patent No.: US 10,381,516 B2
(45) Date of Patent: Aug. 13, 2019

(54) SEMICONDUCTOR LIGHT EMITTING DEVICE HAVING A RECESS WITH IRREGULARITIES

(71) Applicant: NICHIA CORPORATION, Anan-shi, Tokushima (JP)

(72) Inventors: Yohei Wakai, Anan (JP); Masahiko Onishi, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/216,402

(22) Filed: Jul. 21, 2016

(65) Prior Publication Data

US 2016/0329465 A1 Nov. 10, 2016

Related U.S. Application Data

(63) Continuation of application No. 12/561,640, filed on Sep. 17, 2009, now Pat. No. 9,490,393.

(30) Foreign Application Priority Data

Sep. 19, 2008 (JP) ................................ 2008-241798

(51) Int. Cl.
*H01L 33/22* (2010.01)
*H01L 33/20* (2010.01)
(Continued)

(52) U.S. Cl.
CPC ............ *H01L 33/22* (2013.01); *H01L 33/007* (2013.01); *H01L 33/06* (2013.01); *H01L 33/145* (2013.01);
(Continued)

(58) Field of Classification Search
CPC ..... H01L 2924/00; H01L 33/22; H01L 33/20; H01L 33/32; H01L 33/007; H01L 2933/0083; H01L 33/38; B82Y 20/00
(Continued)

(56) References Cited

U.S. PATENT DOCUMENTS 6,277,665 B1 * 8/2001 Ma ...................... H01L 33/0095 257/98
6,495,862 B1 12/2002 Okazaki et al.
(Continued)

FOREIGN PATENT DOCUMENTS

JP 2003-069075 3/2003
JP 2005-268809 A 9/2005
(Continued)

OTHER PUBLICATIONS

Japanese Office Action corresponding to Application No. 2008-241798, dated Dec. 18, 2012. Copy submitted in parent U.S. Appl. No. 12/561,640.

*Primary Examiner* — David Chen
(74) *Attorney, Agent, or Firm* — Squire Patton Boggs (US) LLP

(57) ABSTRACT

A semiconductor light emitting device which includes at least one concave on a light extraction surface opposite to a surface on which a semiconductor stack comprising a light emitting layer between a n-type semiconductor layer and a p-type semiconductor layer is mounted. The concave has not less than two slopes each having a different slope angle in a direction that a diameter of the concave becomes narrower toward a bottom of the concave from an opening of the concave and a slope having a gentle slope angle is provided with irregularities and a slope having a steep slope angle is a flat surface.

27 Claims, 12 Drawing Sheets

(51) Int. Cl.

| | |
|---|---|
| ***H01L 33/44*** | (2010.01) |
| ***H01L 33/00*** | (2010.01) |
| ***H01L 33/06*** | (2010.01) |
| ***H01L 33/14*** | (2010.01) |
| ***H01L 33/32*** | (2010.01) |
| ***H01L 33/38*** | (2010.01) |
| *H01L 33/24* | (2010.01) |
| *H01L 33/58* | (2010.01) |

(52) U.S. Cl.
CPC .............. *H01L 33/20* (2013.01); *H01L 33/32* (2013.01); *H01L 33/38* (2013.01); *H01L 33/44* (2013.01); *H01L 33/0079* (2013.01); *H01L 33/24* (2013.01); *H01L 33/58* (2013.01); *H01L 2933/0083* (2013.01)

(58) Field of Classification Search
USPC .......... 257/79, 94, 95, 98, 99, 103, E33.005, 257/E33.068, E33.074
See application file for complete search history.

(56) References Cited

U.S. PATENT DOCUMENTS

| | | | | |
|---|---|---|---|---|
| 6,657,236 | B1 | 12/2003 | Thibeault et al. | |
| 2002/0123164 | A1 | 9/2002 | Slater, Jr. | |
| 2003/0047745 | A1* | 3/2003 | Suzuki | H01L 33/22 257/103 |
| 2004/0051118 | A1* | 3/2004 | Bruhns | H01L 33/20 257/200 |
| 2004/0217362 | A1 | 11/2004 | Slater et al. | |
| 2005/0179130 | A1 | 8/2005 | Tanaka et al. | |
| 2005/0212002 | A1 | 9/2005 | Sanga et al. | |
| 2006/0001046 | A1* | 1/2006 | Batres | H01L 33/22 257/202 |
| 2006/0091409 | A1* | 5/2006 | Epler | H01L 33/0079 257/95 |
| 2006/0097271 | A1 | 5/2006 | Eisert | |
| 2006/0186418 | A1* | 8/2006 | Edmond | H01L 33/0079 257/79 |
| 2006/0204865 | A1 | 9/2006 | Erchak | |
| 2007/0018187 | A1 | 1/2007 | Lee et al. | |
| 2007/0264733 | A1 | 11/2007 | Choi | |
| 2008/0035953 | A1 | 2/2008 | Beom et al. | |
| 2008/0067916 | A1 | 3/2008 | Hsu et al. | |
| 2008/0128731 | A1 | 6/2008 | Denbaars et al. | |
| 2009/0159908 | A1 | 6/2009 | David | |

FOREIGN PATENT DOCUMENTS

| | | |
|---|---|---|
| JP | 2006-013500 A | 1/2006 |
| JP | 2007-019560 A | 1/2007 |
| JP | 2007-059418 | 3/2007 |
| JP | 2007-067209 | 3/2007 |
| JP | 2007-088277 | 4/2007 |
| JP | 2007-184313 A | 7/2007 |

* cited by examiner

Embodiment

COMPARATIVE EXAMPLE 1

COMPARATIVE EXAMPLE 2

COMPARATIVE EXAMPLE 3

SEMICONDUCTOR LIGHT EMITTING DEVICE HAVING A RECESS WITH IRREGULARITIES

CROSS REFERENCE TO RELATED APPLICATIONS

The present application is a 37 C.F.R. § 1.53(b) continuation of co-pending U.S. patent application Ser. No. 12/561,640, filed on Sep. 17, 2009, which claims the foreign priority benefit under Title 35, United States Code, § 119 (a)-(d) to Japanese Patent Application Number 2008-241798, filed on Sep. 19, 2008, the contents of which are hereby incorporated by reference.

BACKGROUND OF THE INVENTION

1. Field of the Invention

The present invention relates to a semiconductor light emitting device, and more particularly relates to a semiconductor light emitting device which is provided with concaves/convexes on a surface for a light extraction (hereinafter, referred to as light extraction surface) for increasing light extraction efficiency.

2. Description of the Related Art

Conventionally, a compound semiconductor, for example, a gallium nitride (GaN) has been used as a common material for a semiconductor light emitting device such as an LED. In the semiconductor light emitting device described above which uses a GaN-based compound semiconductor, a plurality of concaves/convexes may be formed on a semiconductor layer surface (see paragraph [0050] and FIG. 1 in JP 2000-196152, and paragraphs [0054], [0088], FIG. 1 and FIG. 20 in JP 2007-88277) or a substrate (see paragraph [0042] and FIG. 2 in JP 2003-69075, paragraph [0045] and FIG. 3(b) in JP 2007-67209, and paragraphs [0054], [0088], FIG. 1 and FIG. 20 in JP 2007-88277) for increasing light extraction efficiency of a semiconductor layer which is stacked including a GaN-based light emitting layer in most cases.

In the light emitting device disclosed in JP 2000-196152, many hemispherical convexes are formed spaced each other on a light extraction surface of a GaN-based semiconductor layer which is grown on a sapphire substrate. This is because if the light extraction surface is a flat surface, an obliquely incident light on the flat surface is totally reflected. In the light emitting device, the convex enables the obliquely incident light on the light extraction surface (convex) to pass outside, depending on an angle between a surface of the convex and the incident light.

In the light emitting device disclosed in JP 2003-69075, a substrate is composed of a GaN-based compound semiconductor. In the GaN-based compound semiconductor substrate, a pit (hole, concave) is formed on a surface opposite to a surface on which a device made of, for example, GaN-based semiconductor layer is formed. In the pit, for example, a plurality of planes appear in a step-like pattern and a slope is formed between the planes.

In the light emitting device disclosed in JP 2007-67209, a undoped GaN substrate which has a dislocation density not more than $10^6/cm^2$ is used. In the undoped GaN substrate, macro concaves/convexes (step: 3 μm) are formed by grinding using a grinder on a surface opposite to a surface on which a device made of, for example, GaN-based semiconductor layer is formed, and the ground surface is further chemically treated (dry etching) to form circular cones in high density as micro concaves/convexes (step: not more than 1 μm). In the JP 2007-67209, the final purpose is to realize a high light emitting efficiency, while targeting a reduction of a driving voltage of the light emitting device as a firsthand purpose by disposing the micro convexes in high density. Hence, the light emitting device is provided with the macro convexes in a pre-treatment for disposing the micro convexes in high density finally.

The light emitting device disclosed in JP 2007-88277 is a face-down type device (flip chip). Two types of convexes are formed using a pattern either on a surface opposite to a surface on which a GaN-based semiconductor layer is formed on a sapphire substrate or on a surface of n-type semiconductor layer after removal of the sapphire substrate subsequent to a formation of each electrode. One is a first convex (1 μm) which is formed in a long-period and relatively high. The other is a second convex (0.3 μm) which is formed in a short-period and relatively low. In the technology disclosed in JP 2007-88277, an interval between convexes is set such that, for example, the long-period is not less than 2.3 μm and the short-period is not less than 0.46 μm, based on the experimental data to increase the light extraction efficiency.

However, when concaves/convexes are disposed for increasing the light extraction efficiency, there are various problems depending on a structure of the concaves/convexes. For example, in the light emitting device disclosed in JP 2000-196152, since the convex formed on a semiconductor layer surface is formed in a hemispherical shape, the light extraction efficiency of a light emitted outside from the convex in the right upward direction becomes low, thereby resulting in poor light distribution.

If the structure is a concave, it is expected that light extraction efficiency may be increased by making the concave deeper. For example, when an opening area (surface side portion) of the concave is fixed and the concave has a taper shape in a depth direction from the opening, and if a surface (side surface) of the concave in the depth direction is steeply inclined, a deeper concave may be formed. However, when an electrode (n-electrode or p-electrode) is formed on a semiconductor layer surface where a plurality of concaves/convexes are disposed as the conventional technology, if a deep concave is formed, a current diffusion from the electrode is likely to become poor due to the deep concave even if the electrode is not disposed right above the concave. As a result, there is a tendency that a current flowing downward from the electrode becomes dominant in the total current on the horizontal plane. In addition, to uniformly increase the current diffusion in the horizontal direction from the electrode, it is necessary to increase a film thickness of the semiconductor layer, where the concave is disposed, right beneath the electrode in comparison with a semiconductor layer where the concave is not disposed.

When the electrode is further stacked as described above, it is necessary to form a depth of the concave relatively shallow by making an inclination of the side surface of the concave gentle. It may be possible to form an opening portion of the concave larger in accordance with a shortened depth of the concave by making the inclination of the side surface of the concave gentle. In this case, however, the concaves/convexes become relatively small, and as a result, the light distribution becomes poor due to approaching to a flat surface.

The pit as a concave of the light emitting device disclosed in JP 2003-69075, on which an electrode is stacked, is disposed for suppressing an interference to be generated by multiple reflection of light inside the semiconductor device.

Hence, in JP 2003-69075, there is no description on what structure of the pit improves the light extraction efficiency.

In the light emitting device disclosed in JP 2007-67209, a convex is formed on a backside of an undoped GaN substrate for achieving a reduction of a driving voltage, which is a firsthand purpose. Namely, the convex is not disposed on a light extraction surface of a GaN-based semiconductor layer surface. Therefore, there is no direct relation between a convex structure and light extraction efficiency of a surface on the light extraction side of a semiconductor layer including a light emitting layer.

With respect to the light emitting device disclosed in JP 2007-88277, it is required that positions of a first convex and a second convex are accurately arranged based on a unique theory and experimental data for improving the light extraction efficiency. In addition, a light emitting device other than a facedown type (flip chip) can not be applied to the light emitting device disclosed in JP 2007-88277.

The present invention has been developed considering the foregoing problems, and it is an object of the present invention to provide a semiconductor light emitting device which has high light extraction efficiency of a surface on a light extraction side of a semiconductor layer including a light emitting layer and a good light distribution.

SUMMARY OF THE INVENTION

To solve the foregoing problems, according to a first aspect of the present invention, there is provided a semiconductor light emitting device which has at least one concave on a light extraction surface opposite to a surface on which a semiconductor stack including a light emitting layer between a n-type semiconductor layer and a p-type semiconductor layer is mounted. The concave has not less than two slopes each having a different slope angle in a direction that a diameter of the concave becomes narrower toward a bottom of the concave from an opening of the concave. A slope having a gentle slope angle is provided with irregularities and a slope having a steep slope angle is a flat surface.

In the configuration described above, since the semiconductor light emitting device has a concave on the light extraction surface that is a surface of a semiconductor layer including the light emitting layer, if an electrode (n-electrode or p-electrode) is stacked on the semiconductor layer where the concave is disposed, a current diffusion from the electrode is good (improved) in comparison with a case where a convex is disposed. The reason is as follows. When a plurality of convexes are disposed, two adjacent convexes are connected by only a portion of the semiconductor layer below the bottom of the convexes. On the other hand, when a plurality of concaves are disposed, two adjacent concaves are connected by a portion of the semiconductor layer above the bottom of the concave. Therefore, a current actually flows in the lateral direction on a surface of the semiconductor layer above the concave on which the electrode is disposed. As a result, a uniform light emission can be obtained.

In addition, in the configuration, since the semiconductor light emitting device has at least two slopes each having a different slope angle in the direction where a diameter of the concave becomes narrower toward the bottom, if a light emitted from the light emitting layer enters a steep slope, the light is output in the upper direction of the concave by refraction, or the light is output in the upper direction of the concave by reflection at another steep slope facing the steep slope after the refraction. In addition, since the semiconductor light emitting device has at least two slopes, a number of reflection can be reduced in comparison with a conventional structure where a number of slope is one and multiple reflection is caused, and as a result, the light is efficiently output in the upper direction.

In addition, in the configuration, since the slope having a gentle slope angle is provided with the irregularities and the slope having a steep slope angle is a flat surface in the concave of the semiconductor light emitting device, if a light emitted from the light emitting layer enters and transmits the slope having a gentle slope angle, the transmitted light is scattered. Therefore, even if a light emitted form the light emitting layer obliquely enters the slope having a gentle slope angle, a component of the light propagating in the right upper direction in the total light emitted outside increases. Therefore, the light distribution becomes good, as well as the light extraction efficiency is improved. Furthermore, since a light emitted from the light emitting layer is efficiently reflected when the light enters the slope having a steep slope angle, a light to be emitted outside increases, resulting in improvement of light extraction efficiency.

In addition, in the semiconductor light emitting device according to the present invention, it is preferable that the slope of the concave has a gentler slope angle as the slope becomes closer to the opening of the concave.

In the configuration, since the slope of the concave of the semiconductor light emitting device is formed to be gentler as the slope becomes closer to the opening of the concave, a probability that a light once reflected at a slope is continuously reflected many times is reduced in comparison with a reverse case where the slope is formed to be gentler as the slope becomes closer to the bottom of the concave. In other words, since the light emitting device has a slope having a gentler slope angle as the slope becomes closer to the opening of the concave, a light emitted outside is likely to be extracted in the upper direction at a steep angle in comparison with a case where the slope is formed to be gentler as the slope becomes closer to the bottom of the concave. Furthermore, in the semiconductor light emitting device, since the slope angles of the respective slopes of the concave have the relationship described above, the current is easily diffused, and as a result, a uniform light emission can be achieved (obtained) in comparison with a case where the concave is merely disposed.

In addition, in the semiconductor light emitting device according to the present invention, it is preferable that the concave has a bottom surface at a bottom and the bottom surface is provided with the irregularities.

In the configuration, since the concave of the semiconductor light emitting device has a bottom surface, an optical path length of a light which is emitted from the light emitting layer, enters a slope near the bottom of the concave from outside the concave, passes through inside the concave and re-enters a slope facing the foregoing slope becomes long in comparison with a case where the concave has no bottom surface. If the concave has no bottom surface, a light which is emitted from the semiconductor layer and enters a slope near the bottom of the concave from outside the concave passes through the concave in a short time and re-enters an adjacent semiconductor layer from a slope facing the foregoing slope. On the other hand, in the semiconductor light emitting device that the concave has a bottom surface, the light receives more effect of refraction inside the concave by the prolonged optical path length due to the existence of the bottom surface, and a reflected light at a slope facing the foregoing slope may enter another different slope close to the opening of the concave. Namely, re-entering of a light emitted from a semiconductor layer into the semiconductor layer can be reduced.

In addition, in the semiconductor light emitting device according to the present invention, it is preferable that a plurality of the concaves are disposed on the light extraction surface, adjacent openings of the plurality of the concaves are separated each other, and a separating area which separates the adjacent openings is provided with the irregularities.

In the configuration, since a plurality of concaves of the semiconductor light emitting device are disposed so that the adjacent openings are separated each other, a current diffusion on the light extraction surface becomes good when an electrode is disposed on the light extraction surface. In addition, the light distribution becomes good in comparison with a case where the separating area between the openings of the plurality of concaves is a flat surface.

In addition, in the semiconductor light emitting device according to the present invention, it is preferable that an electrode is disposed on the light extraction surface.

In the configuration, a current diffusion from the electrode in the semiconductor light emitting device becomes good in comparison with a case where a convex is disposed. Here, it is preferable that the electrode is disposed in an area other than the concave on the light extraction surface. By the arrangement of the electrode described above, the light extraction efficiency is increased since the light is not prevented from extracting by the electrode. In addition, since a plurality of electrodes are dispersively arranged, a current in the semiconductor layer is easily and uniformly diffused.

In addition, in the semiconductor light emitting device according to the present invention, a shape of the opening of the concave may be formed in a circle in plane view of the light extraction surface.

In the configuration, the slope of the concave can be easily tapered.

In addition, in the semiconductor light emitting device according to the present invention, it is preferable that a shape of the opening of the concave is a polygon in plane view of the light extraction surface.

In the configuration, openings of adjacent concaves in plane view can be arranged in contact with each other by a point or line in high density.

In addition, in the semiconductor light emitting device according to the present invention, it is preferable that a shape of the opening of the concave is a hexagon in plane view of the light extraction surface.

In the configuration, with respect to an arrangement of a plurality of concaves, respective centers of the plurality of concaves 90 are in line in each row and in line every other column, and the plurality of concaves whose openings are in contact with each other by a tangent line or a point can be close-packed. Namely, many concaves can be effectively and integrally arranged in a small surface area.

In addition, in the semiconductor light emitting device according to the present invention, it is preferable that a depth of the concave has a length not less than half of a thickness between the light extraction surface and the light emitting layer and less than the thickness between the light extraction surface and the light emitting layer.

In the configuration, since the slope of the concave is close to the light emitting layer, the light can be efficiently extracted outside from the semiconductor layer.

In addition, in the semiconductor light emitting device according to the present invention, it is preferable that the slope of the concave is covered with a passivation film.

In the configuration, the concave which has an important role for the light extraction can be protected. Here, it is preferable that the passivation film is formed by a material having a refractive index between those of the semiconductor layer on the slope side and an outside material on the opposite side of the slope so that the light is easily extracted. For example, if the outside is the atmosphere, it is preferable that the passivation film is formed by $SiO_2$ or $Al_2O_3$.

In addition, in the semiconductor light emitting device according to the present invention, it is preferable that the concave is disposed in the n-type semiconductor layer.

In the configuration, since a film thickness of the n-type semiconductor layer is thicker than that of the p-type semiconductor layer, the concave can be formed deeper. In addition, a relatively deep concave can be formed in the total thickness of the semiconductor light emitting layer. As a result, a light can be efficiently extracted outside from the semiconductor layer. In addition, in the configuration, since the n-electrode stacked on the n-type semiconductor layer is small in size in comparison with the p-electrode, when a plurality of n-electrodes are dispersively arranged, the n-electrodes can be easily arranged so that a current uniformly diffuses in the semiconductor layer.

In addition, in the semiconductor light emitting device according to the present invention, it is preferable that the concave is disposed at a position facing a p-electrode which is disposed on the surface on which the semiconductor stack is mounted.

In the configuration, a light emitted from the light emitting layer toward a surface opposite to the light extraction surface is reflected at the p-electrode, and the reflection light is easily extracted outside the semiconductor layer from the concave. In addition, in the configuration, a plurality of n-electrodes can be dispersively arranged in consideration of a current diffusion to be determined depending on the arrangement of the p-electrode. For example, when a plurality of n-electrodes are disposed on an area other than the concave, the p-electrode and the n-electrode are arranged so that the p-electrode does not face the n-electrode in the depth direction of the semiconductor stack. Therefore, a current easily diffuses, especially, in the semiconductor layer. On the other hand, when the p-electrode faces the n-electrode in the depth direction of the semiconductor stack, a current is likely to flow along a path connecting the p-electrode and the n-electrode, and the current does not uniformly flow as seen in the horizontal direction, resulting in generation of uneven current distribution.

According to the present invention, a semiconductor light emitting device is provided, which can easily extract a light outside from a surface on a light extraction side that is a surface of a semiconductor layer including a light emitting layer, and has a good light distribution. In addition, according to the present invention, if an electrode is stacked on a semiconductor layer on which the concave is disposed, a current easily and uniformly diffuses in the semiconductor layer. Since the current easily and uniformly diffuses in the semiconductor layer, it is unnecessary that a semiconductor layer, where the concave just beneath the stacked electrode is disposed, has an excessive thickness. In addition, since the current easily and uniformly diffuses in the semiconductor layer, a depth of the concave can be made shallower in comparison with the conventional one. In this case, the light extraction efficiency can be further improved, accordingly.

BRIEF DESCRIPTION OF THE DRAWINGS

FIG. 5A shows the concave according to the present embodiment and FIG. 5B to FIG. 5D show comparative examples;

DETAILED DESCRIPTION OF THE PREFERRED EMBODIMENT

Figure 1:
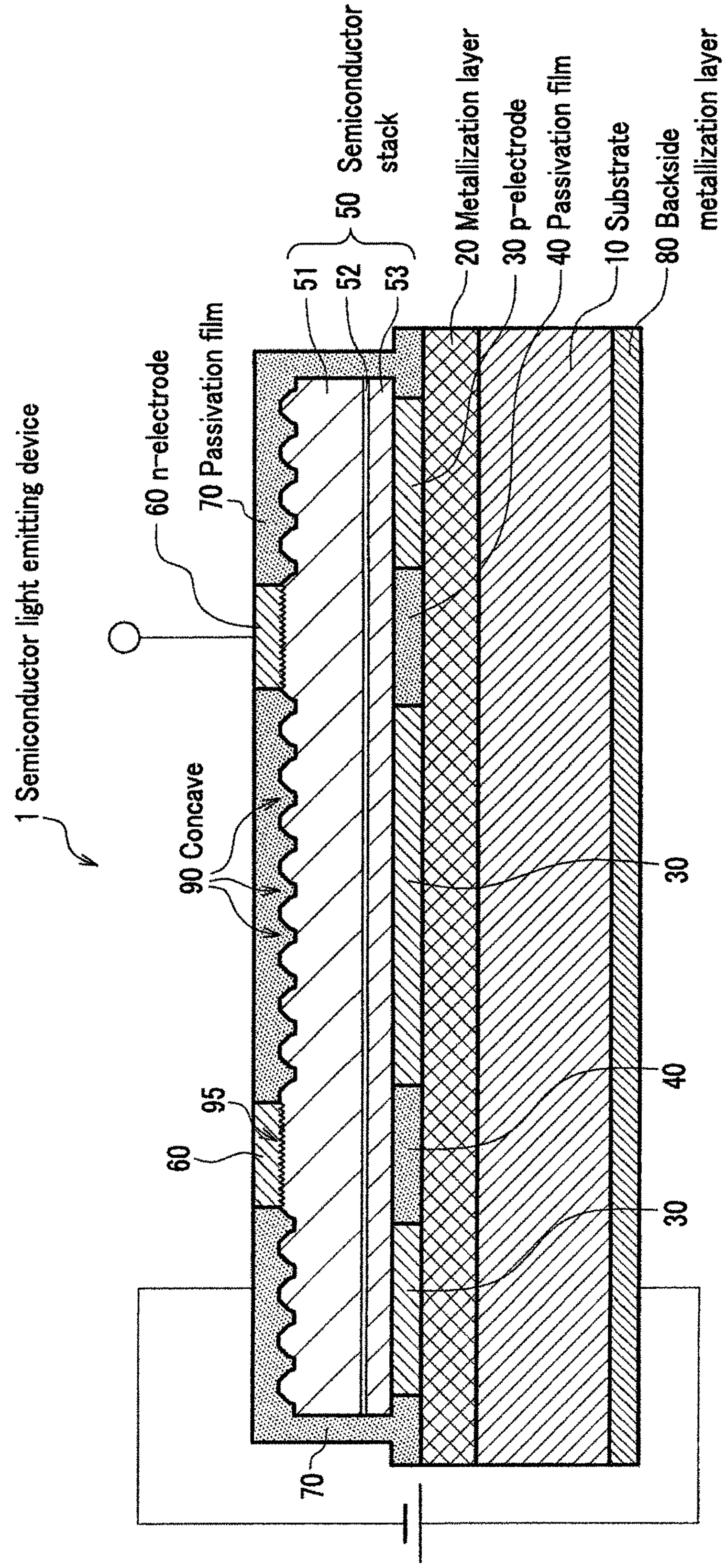
FIG. 1 is a cross sectional view schematically showing a structure of a semiconductor light emitting device according to an embodiment of the present invention.

Hereinafter, a best mode for embodying a semiconductor light emitting device according to the present invention (referred to as embodiment) will be explained by referring to drawings. It is noted that thicknesses and lengths of, for example, constituents shown in the drawings are enlarged for clearly explaining the arrangements.

[Structure of Light Emitting Device]

Figure 2:
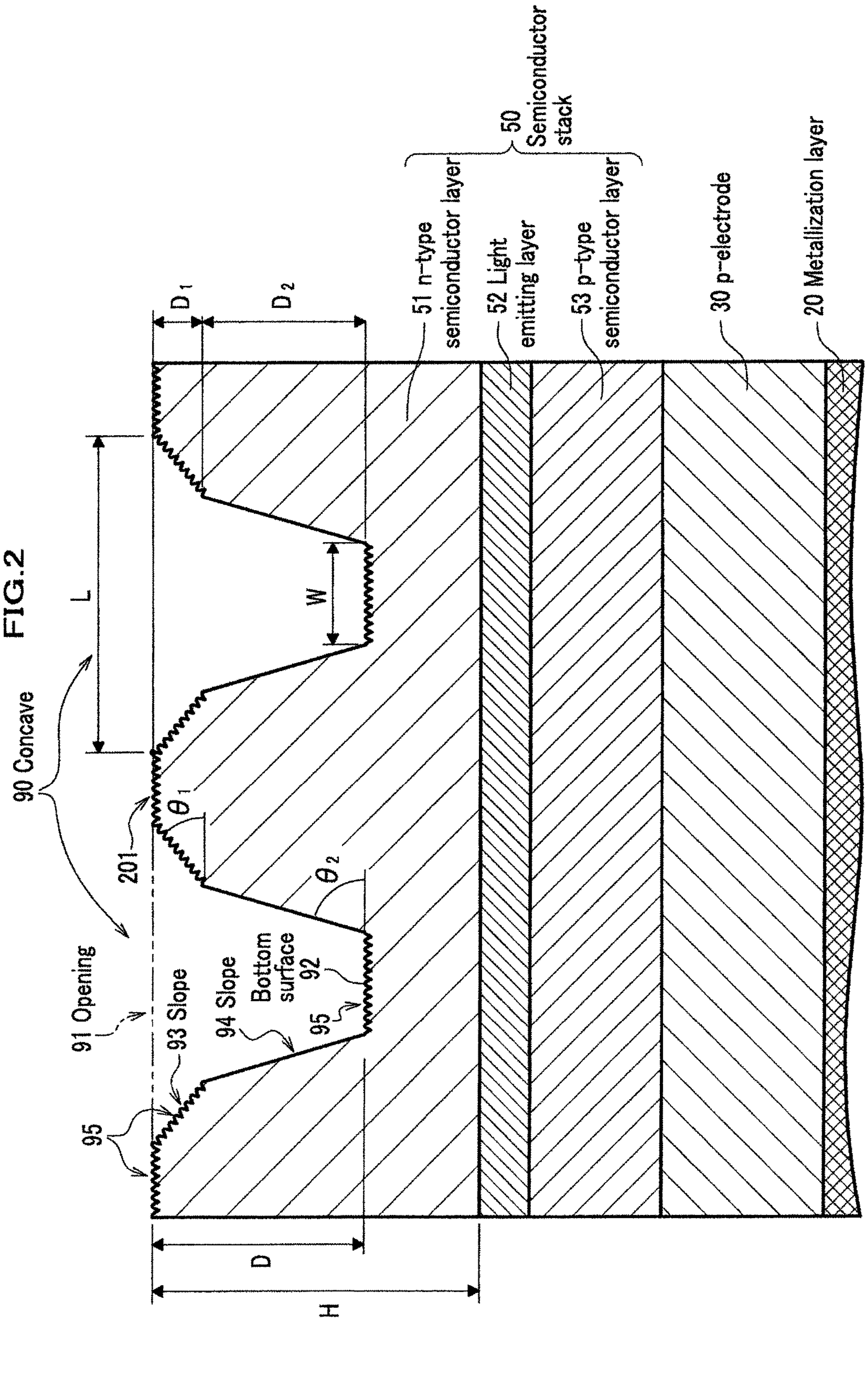
FIG. 2 is a cross sectional view schematically showing an enlarged concave shown in FIG. 1.
Figure 3:
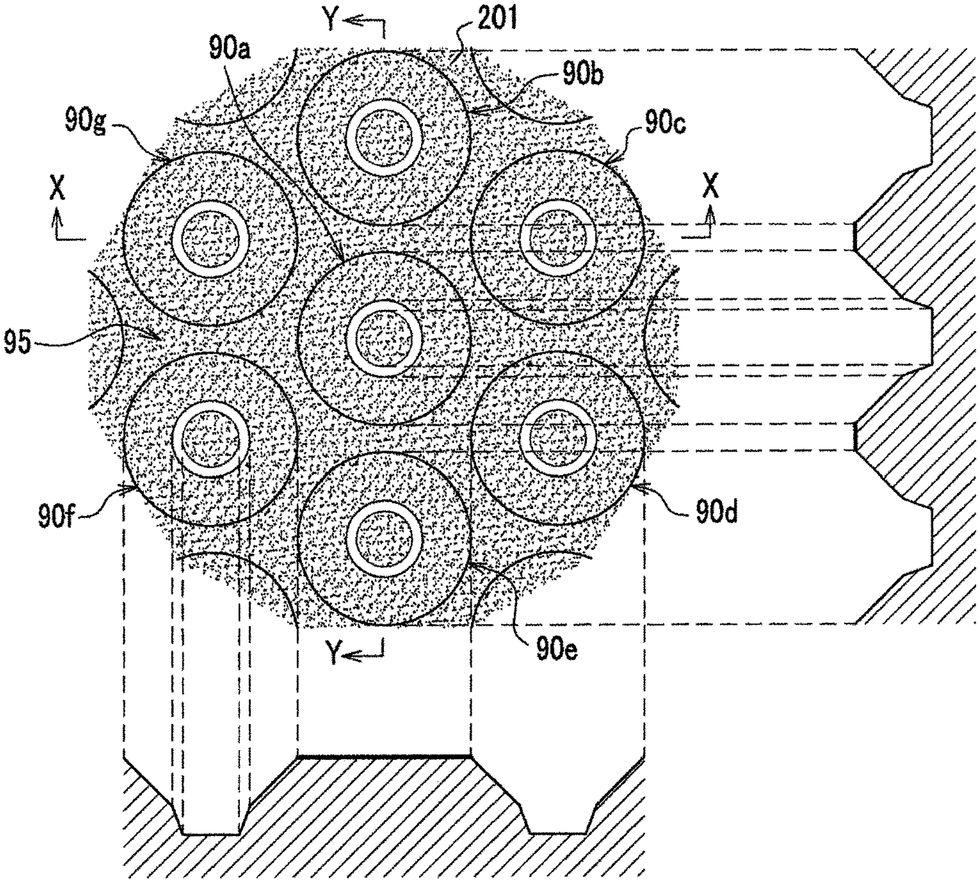
FIG. 3 is a view schematically showing a plane, X-X cross section and Y-Y cross section of a concave.
Figure 4:
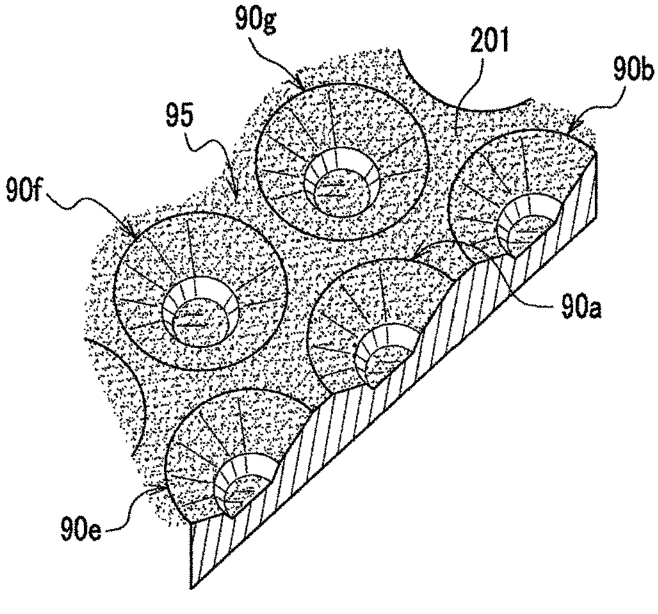
FIG. 4 is a perspective view schematically showing a partial cross section of a concave shown in FIG. 3.

A light emitting device according to an embodiment of the present invention relates to the light emitting device where at least one concave is disposed on a light extraction surface opposite to a surface on which a substrate of a semiconductor stack having a light emitting layer between a n-type semiconductor layer and a p-type semiconductor layer is mounted. First, a structure of the semiconductor light emitting device will be explained by referring to FIG. 1 to FIG. 4. FIG. 1 is a cross sectional view schematically showing a structure of a semiconductor light emitting device according to an embodiment of the present invention, and FIG. 2 is a cross sectional view schematically showing an enlarged concave shown in FIG. 1. In addition, FIG. 3 is a view schematically showing a plane, X-X cross section and Y-Y cross section of a concave, and FIG. 4 is a perspective view schematically showing a partial cross section of the concave shown in FIG. 3.

As shown in FIG. 1, a semiconductor light emitting device 1 according to the embodiment mainly consists of a substrate 10, a metallization layer 20, a p-electrode 30, a passivation film 40, a semiconductor stack 50, an n-electrode 60, a passivation film 70 and a backside metallization layer 80.

(Substrate)

The substrate 10 is made of silicon (Si). Meanwhile, other than Si, for example, a semiconductor substrate made of a semiconductor such as Ge, SiC, GaN, GaAs, GaP, InP, ZnSe, ZnS and ZnO, or a single metal substrate, or a metal substrate made of metal complex which is composed of not less than two metals which are mutually immiscible or have a small solid solubility limit may be used. As a single metal substrate, specifically, a Cu substrate can be used. In addition, as a metal substrate, specifically, a substrate which is composed of at least one metal selected from a highly-conductive metal such as Ag, Cu, Au and Pt and at least one metal selected from a high hardness metal such as W, Mo, Cr and Ni may be used. When a semiconductor material substrate 10 is used, a device, for example, a zener diode may be added to the substrate 10. Further, as a metal substrate, a complex of Cu—W or Cu—Mo may be preferably used.

(Metallization Layer)

A metallization layer 20 is a eutectic alloy for bonding two substrates in a fabrication process of the semiconductor light emitting device 1. Specifically, a metallization layer 21 on the epitaxial side shown in FIG. 8D and a metallization layer 22 on the substrate side shown in FIG. 8E are bonded to form the metallization layer 20. The metallization layer 21 on the epitaxial side is formed by stacking, for example, Ti/Pt/Au/Sn/Au in this order from the bottom in FIG. 8D. In addition, the metallization layer 22 on the substrate side is formed by stacking, for example, Au/Pt/$TiSi_2$, or $TiSi_2$/Pt/Pd in this order from the top in FIG. 8E.

Returning to FIG. 1, explanation for the structure of the semiconductor light emitting device 1 will be continued.

(p-Electrode)

A p-electrode 30 is formed on a mounting surface of a semiconductor stack 50 on the side of substrate 10 and at positions facing the concaves 90 on the uppermost surface of the semiconductor stack 50 in the depth direction.

Specifically, the p-electrode 30 consists of at least two layers, a p-electrode first layer (not shown) on the side of semiconductor stack 50 and a p-electrode second layer (not shown) on the lower side of the p-electrode first layer.

The following materials are commonly used for the p-electrode first layer (not shown). For example, a metal and alloy of Ag, Zn, Ni, Pt, Pd, Rh, Ru, Os, Ir, Ti, Zr, Hf, V, Nb, Ta, Co, Fe, Mn, Mo, Cr, W, La, Cu and Y, and a single film or stacked film of, for example, conductive oxides such as ITO, ZnO and $SnO_2$ may be used. With respect to the p-electrode second layer (not shown), for example, Pt, Au and Ni—Ti—Au based electrode material may be used.

Specifically not shown, if the p-electrode 30 consists of a two-layer structure of p-electrode first layer/p-electrode second layer, a stacked layer structure of, for example, Pt/Au, Pd/Au, Rh/Au and Ni/Au may be used. If the p-electrode 30 consists of a three-layer structure by inserting a p-electrode third layer between the p-electrode first layer and the p-electrode second layer, a stacked layer structure of, for example, Ni/Pt/Au, Pd/Pt/Au and Rh/Pt/Au may be used. Furthermore, if the p-electrode 30 consists of a four-layer structure by inserting a p-electrode third layer and p-electrode fourth layer between the p-electrode first layer and the p-electrode second layer, a stacked layer structure of, for example, Ag/Ni/Ti/Pt may be used.

(Passivation Film)

A passivation film 40 is made of a transparent material which has a refractive index lower than that of a p-type semiconductor layer 53 and formed on a plane identical to that of the p-electrode 30 at portions where the p-electrode 30 is not formed and. The passivation film. 40 is made of an insulator film, preferably made of an oxide film. The passivation film 40 is made of, for example, $SiO_2$ or $ZrO_2$.

The passivation film 40 may be formed by a well known method, such as sputtering, ECR (Electron Cyclotron Resonance) sputtering, CVD (Chemical Vapor Deposition), ECR-CVD, ECR-plasma CVD, evaporation and EB (Electron Beam). The passivation film 40 is preferably formed by, for example, ECR sputtering, ECR-CVD and ECR-plasma CVD.

(Semiconductor Stack)

A semiconductor stack 50 is made of, for example, GaN-based compound semiconductor (for example, GaN, AlGaN, InGaN and AlGaInN). Especially, GaN is preferable because an etched surface of GaN has a fine crystalline surface. The semiconductor stack 50 is formed by sequentially stacking an n-type semiconductor layer 51, a light emitting layer 52 and a p-type semiconductor layer 53 in this order from the side of a light extraction surface opposite to a surface to be mounted on the substrate 10. Meanwhile, the semiconductor stack 50 is generally expressed by $In_xAl_yGa_{1-x-y}N$ ($0 \leq x \leq 1$, $0 \leq y \leq 1$, $0 \leq x+y \leq 1$).

On the light extraction surface, at least one concave 90 is formed. In the embodiment, the light extraction surface is a surface of the n-type semiconductor layer 51. That is, the concave 90 is disposed on the n-type semiconductor layer 51. The concave 90 will be described later in detail.

The n-type semiconductor layer 51 is made of GaN containing, for example, Si, Ge and O (oxygen) as an n-type impurity. The n-type semiconductor layer 51 may be formed by a plurality of layers.

The light emitting layer 52 is made of, for example, InGaN.

The p-type semiconductor layer 53 is made of, for example, GaN containing Mg as a p-type impurity.

On the light extraction surface of the semiconductor stack 50, at least one electrode is formed. In the embodiment, the light extraction surface is formed on a surface of the n-type semiconductor layer 51. Therefore, the electrode formed on the extraction surface is the n-electrode 60.

(n-Electrode)

In the example shown in FIG. 1, the n-electrode 60 is formed on an area other than the concave 90 on the light extraction surface. In the embodiment, since the light extraction surface is a surface of the n-type semiconductor layer 51, the n-electrode 60 is electrically connected to the area other than the concave 90 on the upper surface of the n-type semiconductor layer 51. The n-electrode is connected to the outside by a bonding wire. The n-electrode 60 consists of a metal stack, for example, Ti/Pt/Au, Ti/Pt/Au/Ni, Ti/Al, Ti/Al/Pt/Au, W/Pt/Au and V/Pt/Au, which are formed by stacking the metals in this order on the upper side of the n-type semiconductor layer 51. Meanwhile, the n-electrode 60 may be composed of an ohmic contact and pad electrode.

(Passivation Film)

A passivation film 70 is formed by a material identical to that of the above-mentioned passivation film 40. Namely, for example, if the passivation film 40 is made of $SiO_2$, the passivation film 70 is also made of $SiO_2$, and compositions of the both films may be slightly different each other depending on a forming method thereof. The passivation film 70 covers an upper surface of the n-electrode 60 except a wire bonding area, an inside of the concave 90 including the inner circumferential surface, a surface of the n-type semiconductor layer 51 and a side face of the semiconductor stack 50.

(Backside Metallization Layer)

A backside metallization layer 80 is formed on a surface of the substrate 10 opposite to a surface on which a metallization layer 20 is formed, and functions as an ohmic electrode. The backside metallization layer 80 is made of a metal stack, for example, $TiSi_2$/Pt/Au, which is formed by sequentially stacking the metals in this order from the upper side in FIG. 1.

(Concave Structure)

The concave 90 has, as shown in FIG. 2, two slopes 93, 94 each having a different slope angle in a direction that a diameter of the concave 90 becomes narrower toward a bottom surface 92 from an opening 91. The slope angle is formed to become gentler as a position of the slope is closer to the opening 91 of the concave 90. Namely, the concave 90 becomes narrower as a position leaves from a surface of the n-type semiconductor layer 51, and a side surface of the concave 90 has the two slopes 93, 94 having respective different narrowing angles $\theta_1$, $\theta_2$. Meanwhile, FIG. 2 corresponds to a cross section taken along X-X line of FIG. 3.

In the two slopes, a slope (slope 93) having a gentler slope angle close to the opening 91 is a surface having irregularities 95, and the slope 94 having a steeper slope angle has a flat surface. In the example shown in FIG. 2, the irregularities 95 identical to that of the slope 93 are also formed on a bottom of the concave 90. In addition, in the example, a plurality of the concaves 90 are disposed on the light extraction surface, adjacent openings of the plurality of the concaves 90 are separated from each other, and a separating area 201 is also provided with the irregularities 95.

An average surface roughness (Ra) corresponding to a size of the irregularities 95 formed on the slope 93 is 10 to 100 nm, preferably 15 to 60 nm, and most preferably 20 to 40 nm. Meanwhile, a depth of the concave 90 is defined as described later, and it is, for example, several micrometers (μm). Therefore, the irregularities 95 formed on the slope 93 are called micro irregularities.

The average surface roughness (Ra) in the present invention may be measured using a scanning probe microscope (SPI3800N manufactured by SII).

In addition, the average surface roughness (Ra) can be measured from a cross section of a surface to be measured (hereinafter, referred to as measurement surface) based on a definition of arithmetical mean roughness Ra of JIS B0601.

According to the definition of JIS B0601, an average line (wave line) is acquired from a profiling curve of the measurement surface, and the average line is subtracted from the profiling curve. That is, by replacing the average line with a straight line, a roughness curve is acquired. In addition, according to a coordination system defined by JIS B0601, a direction identical to the average line which is replaced with a straight line is set to an X-axis and a direction orthogonal to the X-axis and parallel to the cross section is set to a Z-axis.

By sampling a standard length 1 from the roughness curve in the X-axis direction, an average line of the sampling portion can be expressed by the following formula (1).

$$Z_0 = \frac{1}{l}\int_0^i Z(x)\,dx \qquad \text{formula (1)}$$

In this case, the average surface roughness (Ra) is a value which is acquired by averaging absolute values of deviations (differences) between Z(x) and $Z_0$, and can be acquired by the following formula (2).

$$Ra = \frac{1}{l}\int_0^i |Z(x) - Z_0|\,dx \qquad \text{formula (2)}$$

Specifically, a measurement surface is observed at across section described above using a microscope which is capable of high magnification such as, for example, TEM, and an average line and a roughness curve are acquired from the profiling curve. An arbitrary 500 nm span is selected on the X-axis, in the selected span, a hundred X-values ($X_1$ to $X_{100}$) are set at constant intervals, and a Z-value ($Z(X_1)$ to $Z(X_{100})$) at each X-value is measured. $Z_0$ can be acquired from the measured Z-value using formula (3).

$$Z_0=(1/100)\times\{Z(x_1)+Z(x_2)+Z(x_3)+\ldots+Z(x_{100})\} \qquad \text{formula (3)}$$

An average surface roughness (Ra) can be acquired using the acquired $Z_0$ and the following formula (4).

$$Ra=(1/100)\times\{|Z(x_1)-Z_0|+|Z(x_2)-Z_0|+\ldots+|Z(x_{100})-Z_0|\} \qquad \text{formula (4)}$$

In the embodiment, the narrowing angles $\theta_1$, $\theta_2$ are defined as an angle which is formed by the horizontal plane of the semiconductor stack 50 and the respective slopes 93, 94. The narrowing angle $\theta_1$ on the surface side is larger than 0° and less than 60°, preferably 20 to 50°. The narrowing angle $\theta_2$ on the side of the light emitting layer 52 is larger than 60° and less than 90°, preferably 60 to 80°. Here, if a difference between the narrowing angles $\theta_1$, $\theta_2$ is considerably large, a light emitted from the light emitting layer 52 at various angles can be easily extracted by efficiently reflecting and transmitting the light by the slopes 93, 94. For example, as shown in FIG. 2, if the two slopes 93, 94 are clearly distinguished, the narrowing angles $\theta_1$, $\theta_2$ and $\theta_2-\theta_1$ become $\theta_1$=45°, $\theta_2$=70° and $\theta_2-\theta_1$=25°. If the narrowing angles $\theta_1$, $\theta_2$ are set in the foregoing ranges, it is relatively easy to set the difference $\theta_2-\theta_1$ between the slope angles to a considerably large value.

If the n-type semiconductor layer 51 is formed by a plurality of layers, each of the slopes 93, 94 is preferably made of GaN. Further, it is more preferable if a concentration of n-type impurity (for example, Si) doped into the GaN of each of the slopes 93, 94 is varied. In addition, it may be possible that the slope 93 on the surface side is made of undoped GaN and the slope 94 on the side of the light emitting layer 52 is made of si-doped GaN.

A depth D of the concave 90 has a length not less than half of a thickness H that is a distance from the light extraction surface to the light emitting layer 52 and less than the thickness H (H/2≤D<H). In addition, in the depth D of the concave 90, it is preferable that a depth D1 corresponding to the slope 93 is deeper than a depth D2 corresponding to the slope 94 for easy forming of the concave 90.

A bottom size W (diameter W) of the concave 90 is not less than ⅕ and not more than ½ of an opening size L (maximum width L) of the opening 91 (L/5≤W≤L/2), while depending on the narrowing angles $\theta_1$, $\theta_2$, and preferably not less than ⅓ and not more than ½ (L/3≤W≤L/2). Here, if a difference between the bottom size W of the concave 90 and the opening size L of the opening 91 is considerably large, a light emitted from the light emitting layer 52 at various angles can be easily extracted by efficiently reflecting and transmitting the light by the slopes 93, 94. For example, if the bottom size W of the concave 90 is set to ⅓ of the opening size L of the opening 91, since the depth D1 corresponding to the slope 93 in the depth D of the concave 90 can be set deeper than the depth D2 corresponding to the slope 94, while setting the narrowing angles $\theta_1$, $\theta_2$ in the foregoing ranges, a formation of the concave 90 becomes easy. Because of the above-mentioned reason, the narrowing angles $\theta_1$, $\theta_2$ are set in the foregoing ranges.

As shown in the plane view of FIG. 3, with respect to an arrangement of the openings 91 of the concaves 90, respective centers of a plurality of concaves 90 are in line in each row and in line every other column. Symbols 90*a*, 90*b*, 90*c*, 90*d*, 90*e*, 90*f* and 90*g* are given to the seven concaves shown in FIG. 3 for convenience. In FIG. 3, the concave 90*a* is surrounded by six concaves 90*b* to 90*g* at predetermined intervals in the clockwise direction. As shown in FIG. 3, each opening of the concaves 90*a* to 90*g* is surrounded by an area 201 of the light extraction surface. Therefore, a current diffusion on the light extraction surface is good. It is noted that the area 201 may be a flat surface or a curved surface.

As described above, since a size of the micro irregularities 95 and a size of the concave 90 are extremely different, the micro irregularities 95 are shown by fine dots in the plane view of FIG. 3 and in FIG. 4. Then, only an area of the steep slope 94 in the concave 90 is shown with white (without fine dots). This is the same with any other drawings such as FIG. 13. It is noted that the micro irregularities 95 are overdrawn for convenience for explanation as shown in FIG. 2.

[Characteristics of Semiconductor Light Emitting Device]

(Light Extraction Efficiency)

Figure 5A:
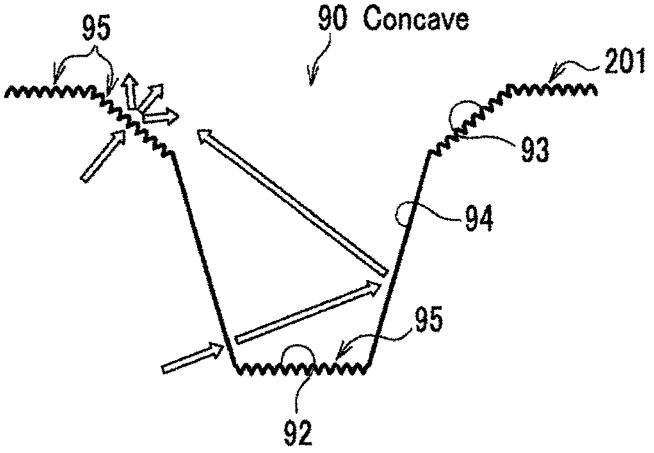
FIG. 5A to FIG. 5D are cross sectional views schematically showing a comparison between a concave of a semiconductor light emitting device according to the present embodiment and concaves other than the present embodiment, where
Figure 5B:
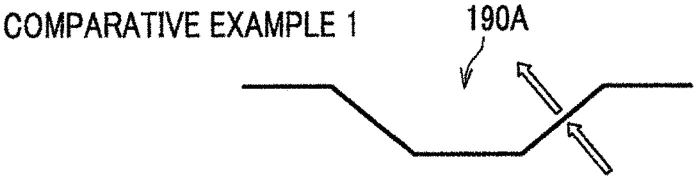
Figure 5C:
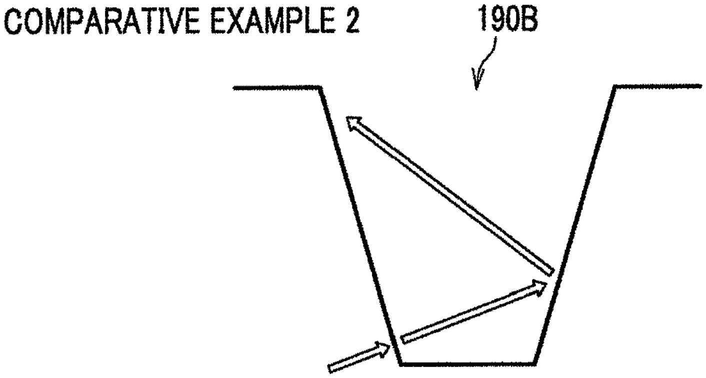
Figure 5D:
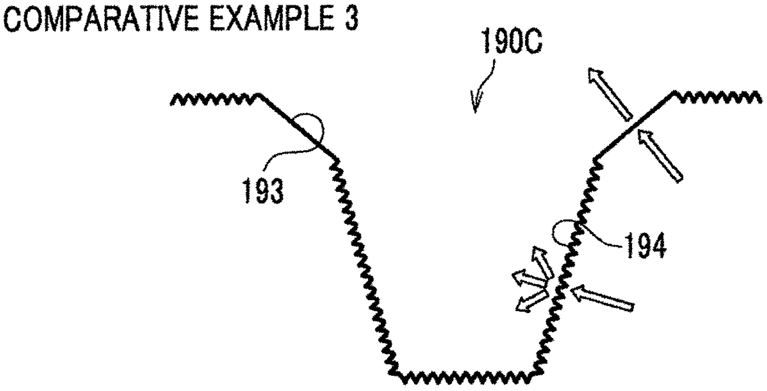

FIG. 5A to FIG. 5D are cross sectional views schematically showing a comparison between a concave of a semiconductor light emitting device according to the embodiment and concaves other than the embodiment. FIG. 5A shows an example (example of embodiment) of a cross section of the concave 90 in the semiconductor light emitting device 1 according to the embodiment, and FIG. 5B to FIG. 5D show cross sections of concaves each having a different structure. A COMPARATIVE EXAMPLE 1 shown in FIG. 5B is a shallow concave 190A with a slope having only a gentle slope angle. In the shallow concave 190A, if a light emitted from a light emitting layer in a semiconductor layer obliquely enters the slope, the light transmits in an oblique direction depending on a difference of a refractive index between an inside and outside substances of the slope, and as a result, the light does not propagate in the right upper direction. Namely, both the light extraction efficiency and light distribution become poor.

A COMPARATIVE EXAMPLE 2 shown in FIG. 5C is a deep concave 190B with a slope having only a steep slope angle. If a light emitted from a light emitting layer in a semiconductor layer enters the slope from inside the deep concave 190B, the light is extracted outside after repeating a reflection at the slope. However, if an electrode is disposed on the light extraction surface of the deep concave 190B, a current diffusion from the electrode becomes poor.

On the other hand, the concave 90 that is an example of the embodiment shown in FIG. 5A has two slopes 93, 94 each having a different slope angle. The slope 93 having a gentle slope angle is a surface which is provided with the irregularities 95 and the slope 94 having a steep slope angle is a flat surface. Therefore, in the concave 90, if a light emitted from a light emitting layer in a semiconductor layer obliquely enters the slope 93 having a gentle slope angle and micro irregularities 95, the light is scattered by the micro irregularities 95, and as a result, a component of the light propagating in the right upper direction increases. In addition, if a light emitted from a light emitting layer in a semiconductor layer enters the slope 94 having a steep slope angle from inside the concave 90, the light is extracted outside after repeating reflection at the slope 94. Namely, both the light extraction efficiency and light distribution become good. In addition, when an electrode is disposed on the light extraction surface of the concave 90, since the slope 93 having a gentle slope angle exists close to the electrode, a current flowing in the right downward direction from the electrode can be reduced in comparison with the deep concave 190B (COMPARATIVE EXAMPLE 2) where a slope having only a steep slope angle is disposed. As a result, a current diffusion from the electrode can be prevented from degrading. Furthermore, in the embodiment, since the micro irregularities 95 are also disposed on the bottom surface 92 and the area 201, when a light emitted from a light emitting layer in a semiconductor layer enters the bottom surface 92 and the area 201, the light is scattered by the micro irregularities 95. Therefore, the light extraction efficiency and light distribution become good in comparison with a flat surface without the micro irregularities 95.

On the other hand, a COMPARATIVE EXAMPLE 3 shown in FIG. 5D is a fictitious concave 190C, where in the two slopes each having a different slope angle, a slope 193 having a gentle slope angle is a flat surface and a slope 194 having a steep slope angle is a surface provided with the irregularities 95. In this case, in the fictitious concave 190C, if a light emitted from a light emitting layer in a semiconductor layer obliquely enters the slope 193 having a flat surface and gentle slope angle, the light is not scattered, and as a result, a component of the light propagating in the right upper direction is not increased. In addition, if a light emitted from a light emitting layer in a semiconductor layer enters the slope 194 provided with the irregularities 95 and having a steep slope angle, the light is scattered. Therefore, a component of the light propagating downward increases and a reflection at the slope 194 becomes poor. As a result, the light is likely to be less extracted outside. Namely, both the light extraction efficiency and the light distribution become poor.

(Light Distribution)

Figure 6:
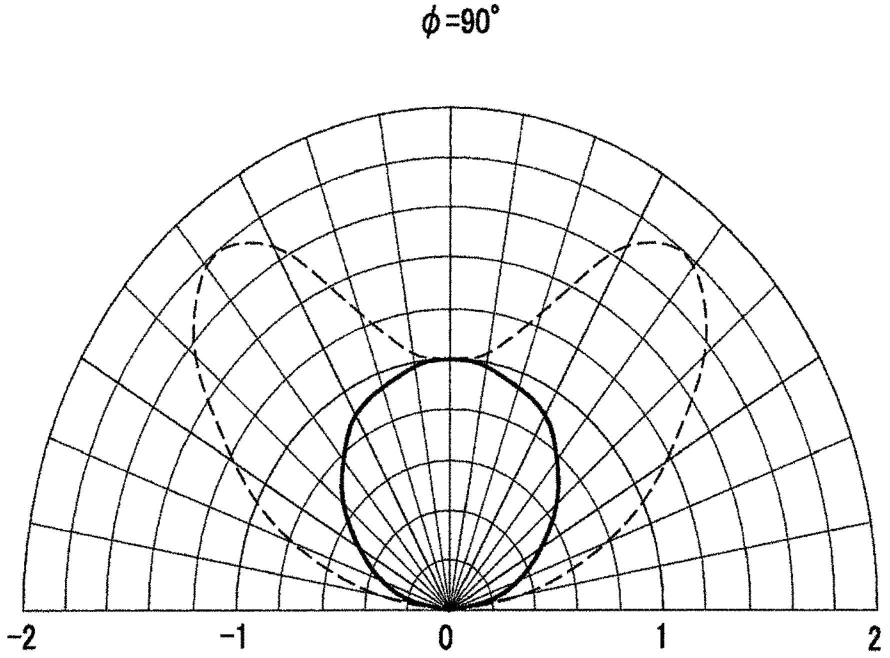
FIG. 6 is a graph showing a relationship between a roughness of a light extraction surface and a light directionality.

FIG. 6 is a graph showing a relationship between a roughness of a light extraction surface and a light directionality. FIG. 6 shows a light directionality with a polar coordinate, and a radial direction indicates a light intensity and a circumferential direction shows an angle. Here, with respect to the circumferential direction, a negative direction of the horizontal axis (X-axis) indicates 0° (zero degree) directivity angle and a positive direction of the horizontal axis (X-axis) indicates 180° directivity angle with reference to 90° (vertical axis: Y-axis) directivity angle. In addition, 0 to 180° directivity angles indicate angles measured in the longitudinal direction (ϕ=90°) of the n-electrode 60 in plane view. In FIG. 6, a dotted line indicates a case where the light extraction surface is flat and a solid line indicates a case where the light extraction surface is provided with concaves/convexes. However, an absolute value at 90° directivity angle is normalized to "1" for making clear the difference between the both light distributions.

As shown in FIG. 6, if the light extraction surface is provided with the concaves/convexes (solid line in FIG. 6), the light intensity is largest at 90° directivity angle. On the other hand, if the light extraction surface is flat (dotted line in FIG. 6), the light intensity is largest at 50° and 130° directivity angles, which is 1.8 times larger than the light intensity at 90° directivity angle. Namely, if the light extraction surface is provided with concaves/convexes, the light distribution is improved in comparison with a flat surface.

Figure 7:
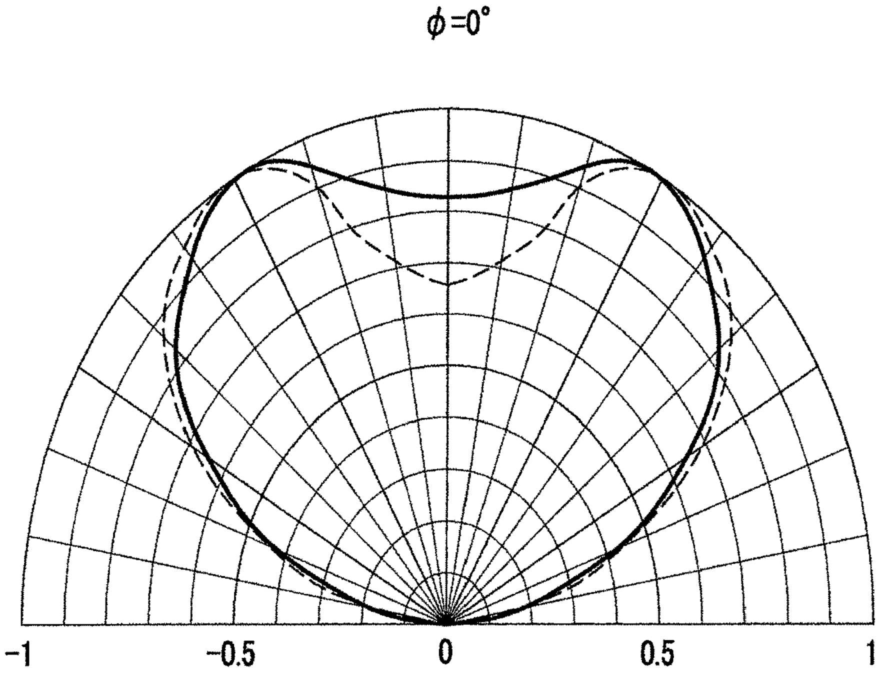
FIG. 7 is a graph showing an example of a light directionality of a semiconductor light emitting device according to the embodiment.

FIG. 7 is a graph showing an example of a light directionality of a semiconductor light emitting device according to the embodiment. FIG. 7 is drawn with the same scheme as FIG. 6. In FIG. 7, a solid line indicates data of the semiconductor light emitting device 1 according to the embodiment, that is, the data in a case where the semiconductor light emitting device 1 is provided with the micro irregularities 95 like the concave 90. In addition, a dotted line indicates data in a case where the semiconductor light emitting device 1 is not provided with the micro irregularities 95. As shown in FIG. 7, it is known that an existence of micro irregularities effects on a light intensity at around 90° directivity angle. Namely, if the micro irregularities 95 are disposed on a concave, a light intensity increases at around 90° directivity angle, and the light distribution is improved.

It is noted that in FIG. 7, absolute values at 60° and 120° directivity angles are normalized to "1" for making clear the difference between the two data. In addition, 0° to 180° directivity angles are measured in the lateral direction of n-electrode 60 (ϕ=0°) in plane view. A light intensity in the radial direction per unit length in FIG. 7 is half of FIG. 6.

[Fabrication Process of Semiconductor Light Emitting Device]

A fabrication method of the semiconductor light emitting device shown in FIG. 1 will be explained by referring to FIG. 8A to FIG. 8F and FIG. 9A to FIG. 9E (see FIG. 1 to FIG. 4 as appropriate). FIG. 8A to FIG. 8F and FIG. 9A to FIG. 9E are cross sectional views schematically showing a fabrication process of the semiconductor light emitting device shown in FIG. 1.

Figure 8A:
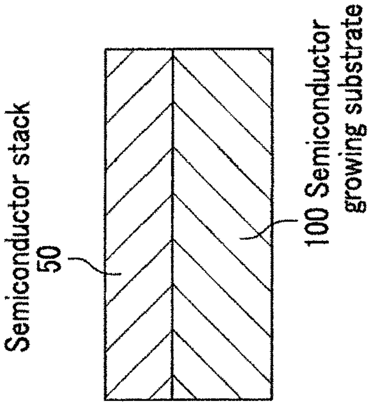
FIG. 8A to FIG. 8F are cross sectional views schematically showing fabrication processes of the semiconductor light emitting device shown in FIG. 1 (first)

First, as shown in FIG. 8A, a n-type semiconductor layer 51, a light emitting layer 52 and a p-type semiconductor layer 53 (see FIG. 1) are grown in this order on a substrate 100 for growing semiconductor layers (hereinafter, referred to as semiconductor growing substrate 100) to form a semiconductor stack 50. The semiconductor growing substrate 100 is a substrate which is removed in a later process and made of a sapphire having one of a C-plane, R-plane and A-plane as amain plane. Meanwhile, a substrate different from sapphire may be used as the semiconductor growing substrate 100. For example, an insulator substrate such as spinel ($MgAl_2O_4$), SiC (including 6H, 4H and 3C), ZnS, ZnO, GaAs and an oxide substrate whose lattice matches with those of nitride semiconductors may be used as the semiconductor growing substrate 100, which are materials on which nitride semiconductors can be grown and well known as a substrate material.

Figure 8B:
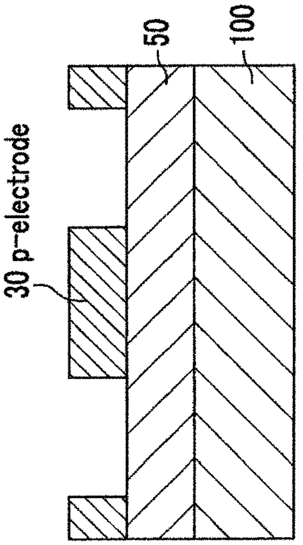
Figure 8C:
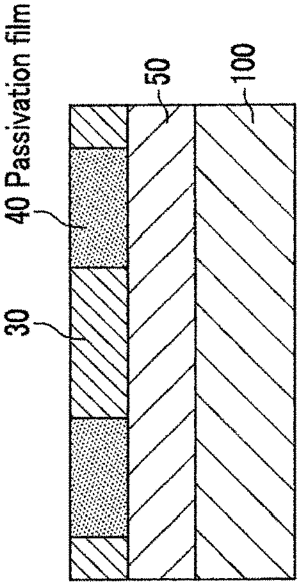
Figure 8D:
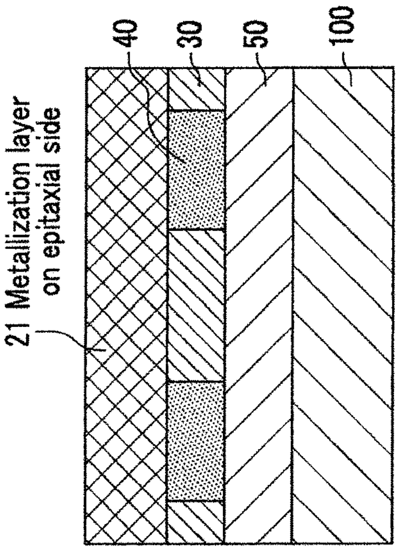
Figure 8E:
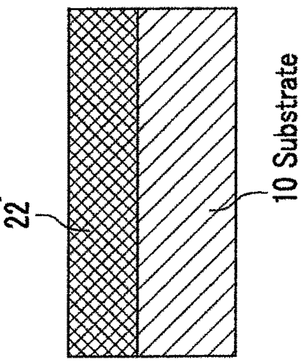
Figure 8F:
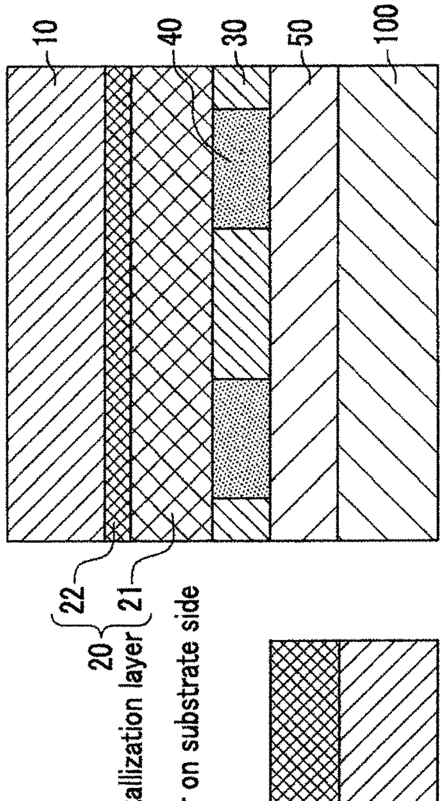

Next, as shown in FIG. 8B, a p-electrode first layer and a p-electrode second layer, which are not shown, are grown in this order on an upper surface of the semiconductor stack 50 (surface of p-type semiconductor layer 53) to form a p-electrode 30 using magnetron sputtering. Next, as shown in FIG. 8C, a passivation film 40 is formed between the p-electrodes 30, 30 using ECR sputtering. Next, as shown in FIG. 8D, a metallization layer 21 on an epitaxial layer side is grown on the p-electrode and the passivation film 40. In addition, before or after, or in parallel with forming the metallization layer 21 on the epitaxial layer side, a metallization layer 22 on a substrate side is grown on the substrate 10 as shown in FIG. 8E. Next, as shown in FIG. 8F, the metallization layer 22 on the substrate side and the metallization layer 21 on the epitaxial side are bonded by turning back the substrate 10 on which the metallization layer 22 on the substrate side is grown. A metallization layer 20 is formed by the bonded metallization layers 21 and 22 on the epitaxial layer side and on the substrate side, respectively.

Figure 9A:
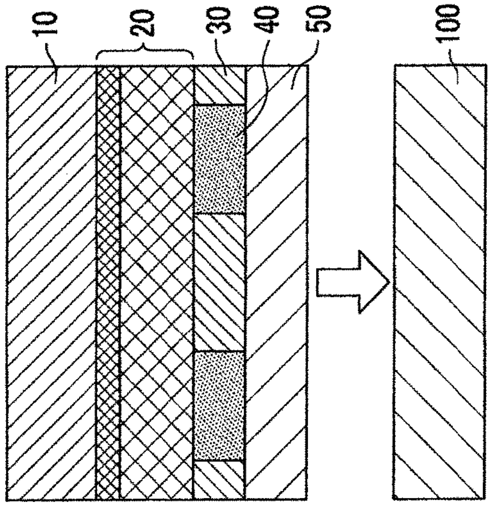
FIG. 9A to FIG. 9E are cross sectional views schematically showing fabrication processes of the semiconductor light emitting device shown in FIG. 1 (second)
Figure 9B:
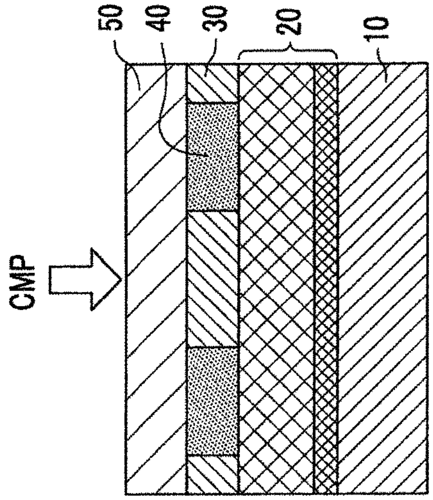
Figure 9C:
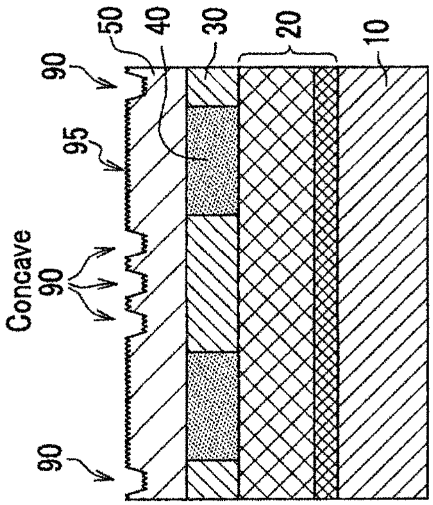

Next, as shown in FIG. 9A, the semiconductor growing substrate 100 is removed from the semiconductor stack 50. As shown in FIG. 9B, an upper surface (surface of n-type semiconductor layer 51) of the semiconductor stack 50, which is an uppermost surface due to turning back of the substrate 10 from which the semiconductor growing substrate 100 is removed, is polished by CMP (Chemical Mechanical Polishing). Next, as shown in FIG. 9C, the concave 90 is formed on the upper surface (surface of n-type semiconductor layer 51) of the semiconductor stack 50 by a process described later.

Figure 9D:
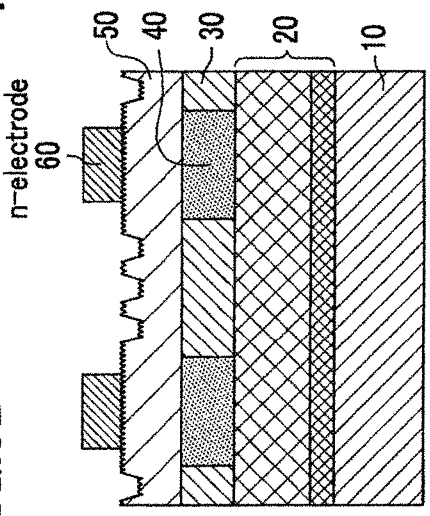

After forming the concave 90, as shown in FIG. 9D, the n-electrode 60 is formed on an area where the concave 90 is not formed on the upper surface (surface of n-type semiconductor layer 51) of the semiconductor stack 50.

Figure 9E:
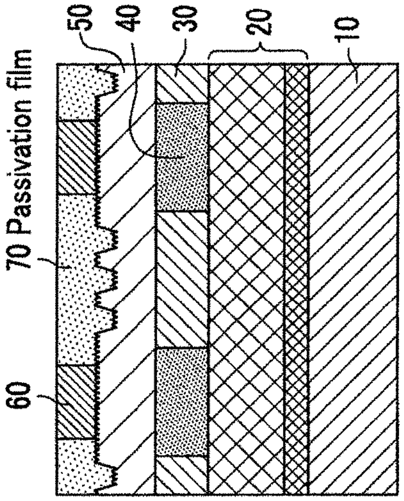

Next, as shown in FIG. 9E, an inside of the concave 90 including a circumferential surface and the upper surface (surface of n-type semiconductor layer 51) of the semiconductor stack 50 are covered with a passivation film 70. It is noted that as shown in FIG. 1, a side face of the semiconductor stack 50 is also covered with the passivation film 70. Next, a backside metallization layer 80 as an ohmic electrode is formed on the surface of the substrate 10, which became an uppermost surface (bottommost surface in FIG. 1) by turning back the substrate 10 (not shown), then, the wafer is diced. Namely, the wafer is divided into bars, a mirror is formed on an end face of a resonator, the bars are cleaved into chips and wires are bonded to the n-electrode 60 and a surface of the backside metallization layer 80 to fabricate the semiconductor light emitting device 1 shown in FIG. 1.

[Forming Process of Concave]

Figure 10:
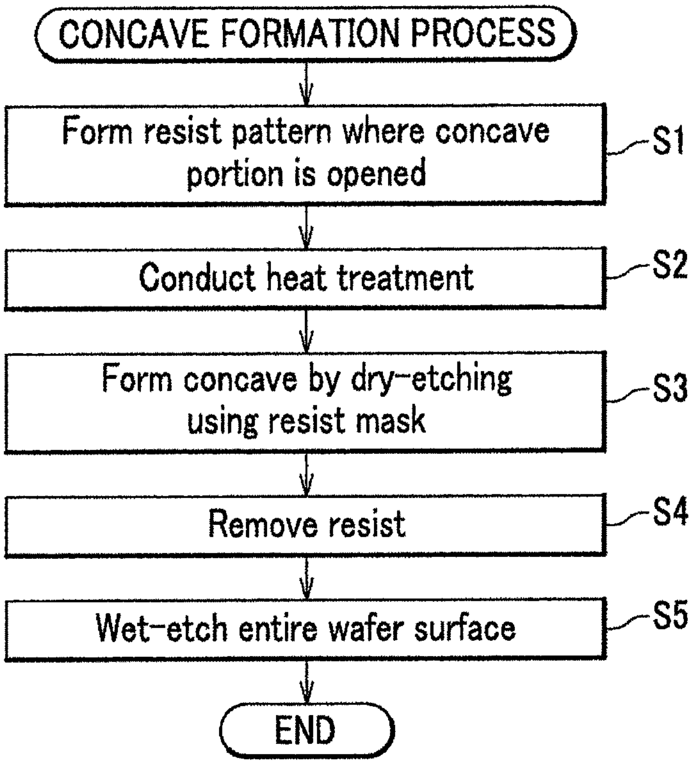
FIG. 10 is a flowchart showing formation processes of the concave shown in FIG. 9C.
Figure 11:
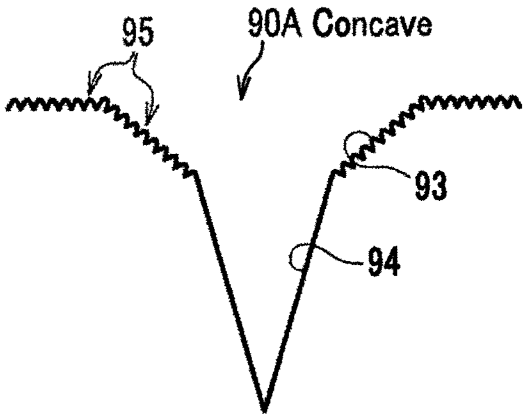
FIG. 11 is a view schematically showing a cross section in a depth direction of a first modified example of a concave structure.

Next, a forming process of the concave 90 will be explained by referring to FIG. 10 (see FIG. 2 as appropriate). FIG. 10 is a flowchart showing a forming process of a concave shown in FIG. 9C.

A resist pattern having an opened area corresponding to the concave 90 is formed on an upper surface (surface of n-type semiconductor layer 51) of the semiconductor stack 50 by, for example, photolithography (step S1). After patterning the resist, a post-bake (heat treatment) is conducted at, for example, 180° C. so that an end portion of the resist pattern is deformed to incline by the heat treatment of the resist pattern, as well as abridge formation of the resist is promoted (step S2). Through the post-bake, a structure where the end portion of the resist pattern is collapsed to incline from the periphery toward the area to become the concave 90 is formed. Namely, an inclined portion formed by the collapse of the pattern end portion is formed just inside from a periphery of the etching area. As a result, an area having a low etching rate in comparison with no resist area is formed.

Subsequently, an area to become the concave 90 is dry-etched by, for example, RIE (Reactive Ion Etching) using the resist mask (step S3). Since the area having a low etching rate is formed on the upper surface (surface of n-type semiconductor layer 51) of the semiconductor stack 50, the surface is etched so that there are two inclined stages.

Next, the resist pattern used for the etching as a mask is stripped (step S4). A well known common method is used for stripping the resist pattern. For example, a photoresist stripping liquid may be used, or an apparatus which irradiates the photoresist with, for example, oxygen plasma (asking) such as an asher may be used.

Next, an entire wafer surface is wet-etched without patterning. Regarding an etchant of wet-etching, as an anisotropic etchant, for example, KOH solution, TMAH (tetramethyl ammonium hydroxide) alkaline solution and EPD (ethylene diamine pyrocatechol) may be used. With the etching described above, the micro irregularities 95 are formed on an area other than the slope 94 having a steep slope angle. Namely, the micro irregularities 95 are formed on the slope 93 having a gentle slope angle, the bottom surface 92 and the area 201 on the light extraction surface. It is noted that the micro irregularities 95 are formed beneath the n-electrode 60 (see FIG. 1 and FIG. 9E)

According to the semiconductor light emitting device 1 of the embodiment, since the concave 90 is disposed on the light extraction surface that is the upper surface of the semiconductor stack 50, it becomes easy to efficiently extract a light outside from a surface on the light extraction side in comparison with a case where a convex is disposed instead of the concave 90. In addition, in the concave 90, since the slope 93 having a gentle slope angle is provided with the micro irregularities 95 and the slope 94 having a steep slope angle has a flat surface, the light directionality becomes good. Furthermore, a current diffusion from the n-electrode 60 becomes good due to existence of the concave 90. In addition, in the semiconductor light emitting device 1, since the two slopes 93, 94 each having a different slope angle in the direction that a diameter of the concave 90 becomes narrower toward the bottom surface 92 from the opening 91 are formed to have a gentler angle as the slopes 93, 94 become closer to the opening 91 of the concave 90, a light emitted from the light emitting layer 92 is easily extracted outside by reflection. In addition, in the semiconductor light emitting device 1, since the concave 90 has the bottom surface 92, a re-entering of a light, which is emitted from the semiconductor stack 50 (semiconductor layer), into the semiconductor stack 50 can be reduced.

The embodiment of the present invention has been explained. However, the present invention is not limited to the embodiment described above and can be embodied in various forms without departing from the spirits of the invention. For example, the light extraction surface of the semiconductor stack 50 was the n-type semiconductor layer 51. However, the light extraction surface may be the p-type semiconductor layer 53 and the concave 90 may be disposed on the p-type semiconductor layer 53. Meanwhile, it is preferable that the concave 90 is disposed like the embodiment since the concave 90 can be formed deeper. In addition, in the embodiment, the two slopes 93, 94 were disposed in the concave 90. However, a concave which has not less than three slopes has the same advantages as long as a narrowing angle (slope angle) of a slope is formed to be gentler as the slope becomes closer to the opening 91 of the concave 90. In this case, a narrowing angle corresponding to at least one slope to be disposed between the slopes 93, 94 is set between $\theta_1$ and $\theta_2$ as appropriate so that a difference among the narrowing angles becomes as equal as possible, while the narrowing angle $\theta_1$ corresponding to the slope on the surface side and the narrowing angle $\theta_2$ corresponding to the slope on the light emitting layer 52 are set in the above-mentioned ranges. As a result, a light emitted from the light emitting layer 52 at various angles can be easily extracted by efficiently reflecting and transmitting by not less than three slopes. In addition, in the embodiment, the n-electrode 60 is disposed in an area without the concave 90. However, the n-electrode 60 may be disposed on the concave 90. It is noted that the n-electrode 60 is preferably disposed like the embodiment because a current in the semiconductor stack 50 (semiconductor layer) is easily diffused. A material composing the semiconductor stack 50 of the semiconductor light emitting device 1 is not limited to nitride semiconductors.

In the embodiment, the bottom surface 92 of the concave 90 was flat. However, it is not always necessary that the bottom surface is flat, but the bottom surface, for example, may be a curved surface protruding downward. In addition, in the present invention, the bottom surface 92 is not always necessary on a bottom of the concave 90, but the slope 94 may be narrowed in a reverse circular cone toward the bottom.

Figure 12:
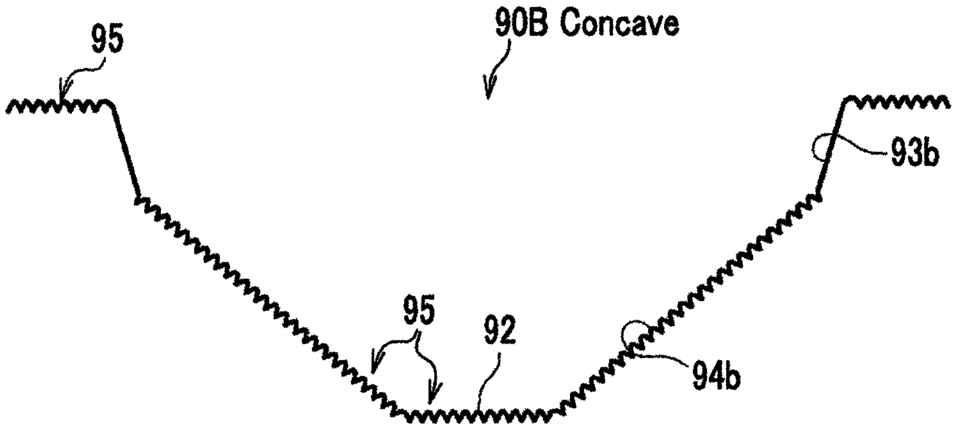
FIG. 12 is a view schematically showing a cross section in a depth direction of a second modified example of a concave structure.

In addition, in the embodiment, a slope angle of each of the slopes 93, 94 of the concave 90 is formed to be gentler as the slope is closer to the opening 91 of the concave 90. However, the present invention is not limited to this. Like a concave 90B shown in FIG. 12, a slope 93B having a steep slope angle and a slope 94B having a gentle slope angle may be formed in this order from the opening. In this case, a slope having a gentle slope angle is provided with the irregularities 95 and a slope having a steep slope angle has a flat surface as the foregoing embodiment. Therefore, as shown in FIG. 12, the micro irregularities 95 are continuously formed from the slope 94B to the bottom surface 92. A semiconductor light emitting device having such a structure as the concave 90B also has good light extraction efficiency and good light distribution.

In addition, with respect to an opening shape of a concave in plane view, various modifications may be possible. The variations of the shape will be explained below.

First Modified Example

Figure 13:
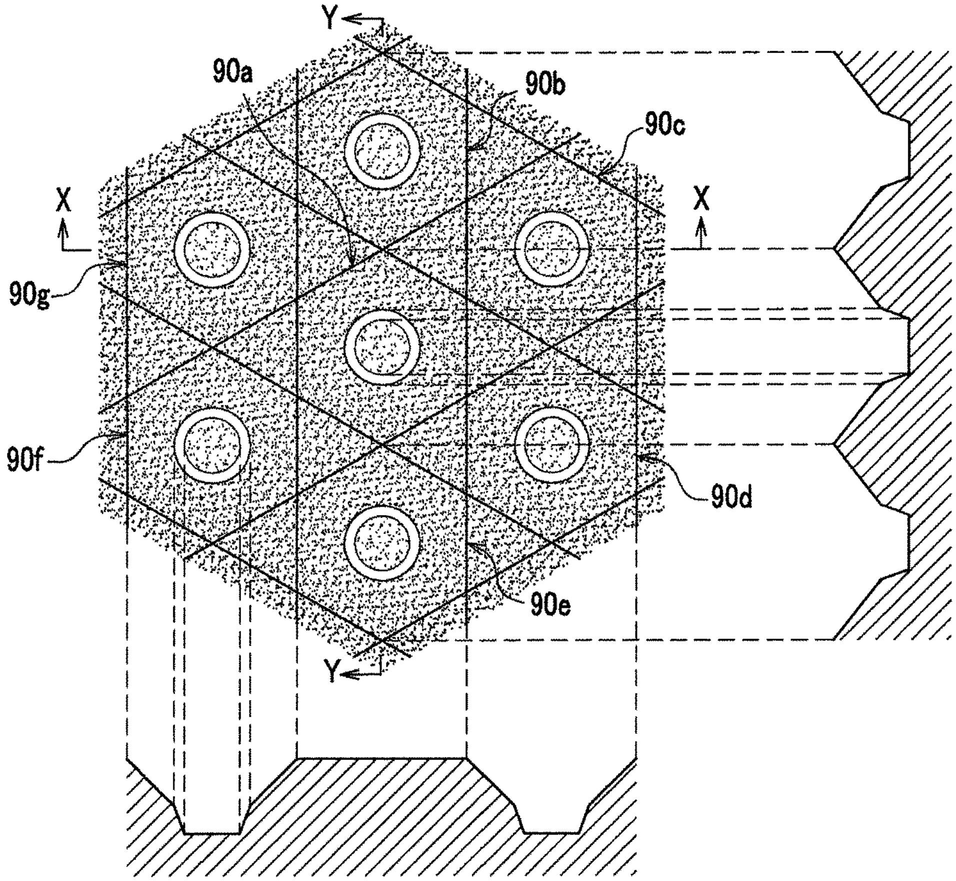
FIG. 13 is a view schematically showing a plane, X-X cross section and Y-Y cross section of a first modified example of an opening of a concave.
Figure 14:
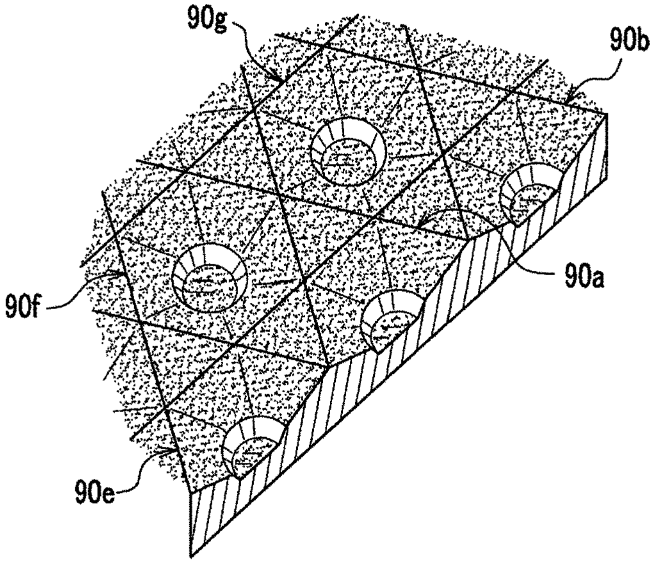
FIG. 14 is a perspective view schematically showing a partial cross section of the concave shown in FIG. 13.

FIG. 13 is a view schematically showing a plane, X-X cross section and Y-Y cross section of a first modified example of an opening of a concave, and FIG. 14 is a perspective view schematically showing a partial cross section of the first modified example taken along Y-Y cross section shown in FIG. 13. In the first modified example, a configuration of the opening is the same as that of concave 90 shown in FIG. 3 except that a shape of a plurality of concave openings is a hexagon and that a density of the concave opening is not so high as shown in FIG. 3. Namely, for example, in the concave 90*a*, each vertex of the regular hexagon as an opening is in contact with six concaves 90*b* to 90*g* surrounding the concave 90*a*. In other words, the concave 90*a* is surrounded by six regular triangles shown in plane view of FIG. 13. These six triangles are located on the light extraction surface. Therefore, a current diffusion on the light extraction surface becomes good. It is noted that each vertex of the regular hexagon as an opening may be separated by a predetermined distance from the six surrounding concaves.

Second Modified Example

Figure 15:
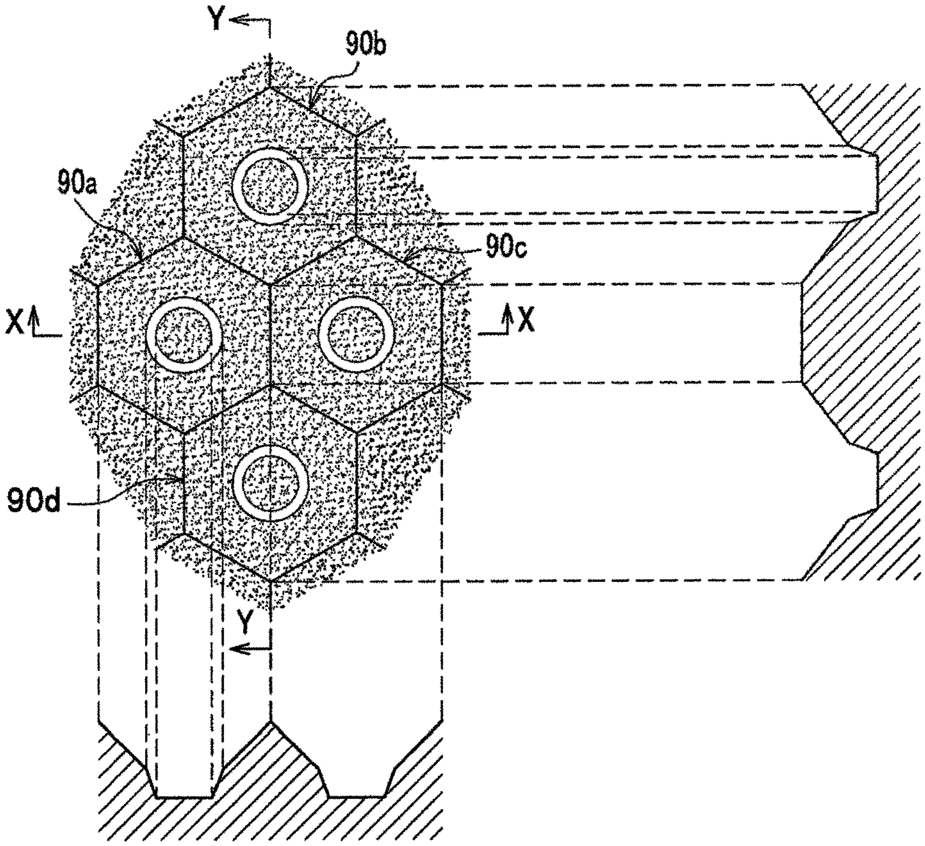
FIG. 15 is a view schematically showing a plane, X-X cross section and Y-Y cross section of a second modified example of an opening of a concave.
Figure 16:
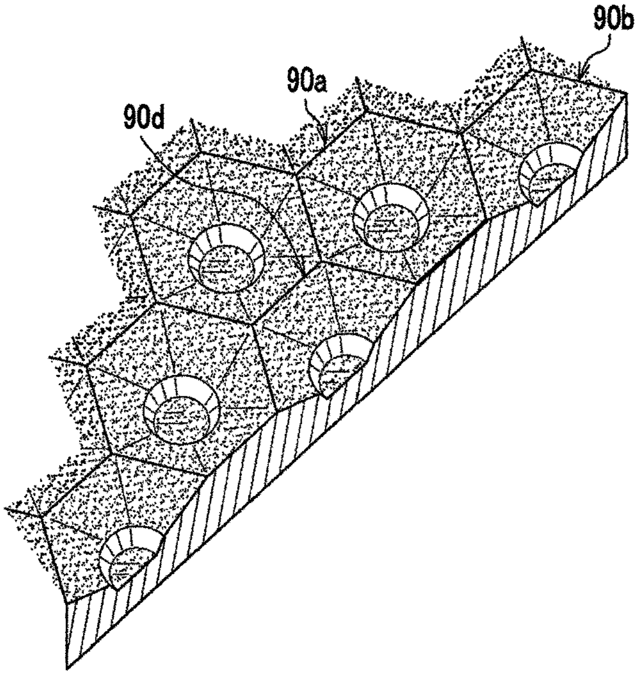
FIG. 16 is a perspective view schematically showing a partial cross section of the concave shown in FIG. 15.

FIG. 15 is a view schematically showing a plane, X-X cross section and Y-Y cross section of a second modified example of an opening of a concave, and FIG. 16 is a perspective view schematically showing a partial cross section of the second modified example taken along Y-Y cross section shown in FIG. 15. In the second modified example, an arrangement of openings of a plurality of concaves is shown in FIG. 15, which is a close-packed structure. Namely, for example, the concave 90*a* is in contact with six surrounding concaves by respective sides of a regular hexagon as an opening. In addition, the concave 90*a* is in contact with six surrounding concaves at respective vertexes of the regular hexagon as an opening. Here, as shown in FIG. 16 which is a Y-Y arrow cross section of FIG. 15, for example, each side of the regular hexagon as an opening of the concave 90*a* is straight and on the light extraction surface. As described above, in the second modified example, each side and each vertex of the opening of the concave are in contact with adjacent concaves by forming a close-packed structure. In the semiconductor light emitting device having the concave described above, many concaves can be efficiently arranged and integrated in a small surface.

Third Modified Example

Figure 17:
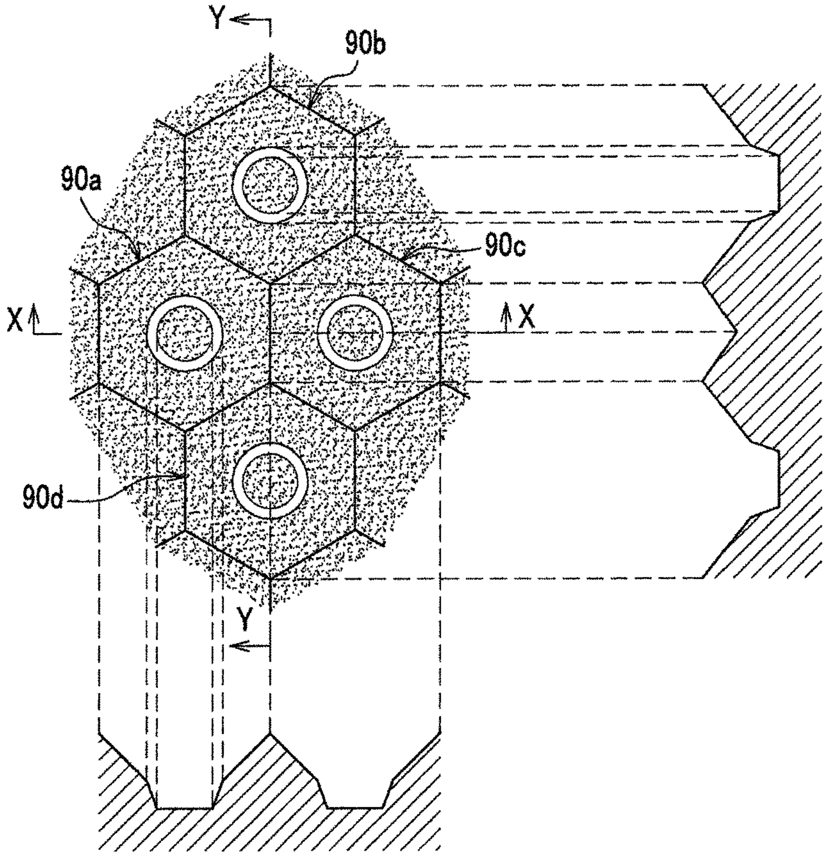
FIG. 17 is a view schematically showing a plane, X-X cross section and Y-Y cross section of a third modified example of an opening of a concave.
Figure 18:
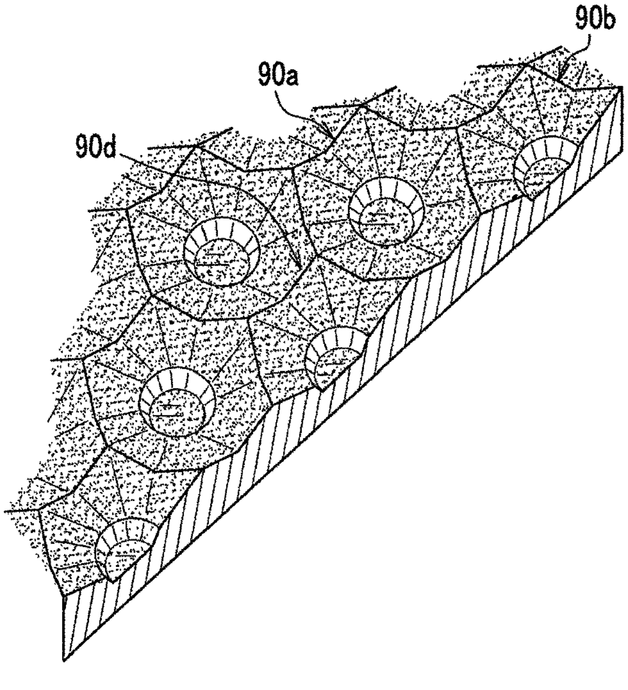
FIG. 18 is a perspective view schematically showing a partial cross section of the concave shown in FIG. 17.

FIG. 17 is a view schematically showing a plane, X-X cross section and Y-Y cross section of a third modified example of an opening of a concave, and FIG. 18 is a perspective view schematically showing a partial cross section of the third modified example taken along Y-Y cross section of FIG. 17. In the third embodiment, each side of a regular hexagon as an opening of the concave 90*a* is not a straight line, but a v-shaped line having a vertex (bottom) at the center of the side. Namely, only respective vertexes of the regular hexagon in plane view are located on a plane identical to the light extraction surface. Here, an upper slope (slope 93, see FIG. 2) is located below a valley of the V-shape. In other words, the V-shape is within the upper slope (slope 93, see FIG. 2). Therefore, there is an advantage that a current can be easily and uniformly diffused in comparison with a case where the v-shape is not formed. Other characteristics are the same with those of the second modified example and the explanation will be omitted.

Other Modified Examples

A circle and hexagon in plane view as a shape of the opening 91 of the concave 90 have been exemplified. Of course, a polygon and ellipsoid such as a triangle and quadrangle can be surely used. A circle or hexagon which is capable of forming a close-packed structure is preferable for efficiently diffusing a current and improving the light extraction efficiency.

Embodiment

A semiconductor light emitting device according to the embodiment of the present invention was fabricated for confirming advantages of the present invention. Specifically, a semiconductor light emitting device 1 was fabricated according to the fabrication processes shown in FIG. 8A to FIG. 10.

For fabricating the semiconductor light emitting device 1, a sapphire substrate was used for the substrate 100 for growing semiconductor layers (semiconductor growing substrate 100). In addition, as a substrate 10, a silicon (Si) wafer substrate 400 μm thick was used. The following layers were grown on the sapphire substrate for forming the semiconductor stack 50. First, a n-type cladding layer composed of Si-doped AlGaN and a n-type light guiding layer composed of GaN were grown on the sapphire substrate. With the processes described above, the n-type semiconductor layer 51, 4000 nm thick was formed. Subsequently, a barrier layer composed of Si-doped $In_{0.05}Ga_{0.95}N$ and a well layer composed of undoped $In_{0.1}Ga_{0.9}N$ were alternately grown two times, and further another barrier layer was grown thereon to form a multiple-quantum well (MQW) structure that is the light emitting layer 52. Next, a p-type electron confinement layer composed of Mg-doped AlGaN, a p-type light guiding layer composed of undoped GaN, a p-type cladding layer composed of a super lattice layer which was formed by alternately growing a undoped $Al_{0.16}Ga_{0.84}N$ layer and a Mg-doped GaN layer and a p-type contact layer composed of Mg-doped p-type GaN were grown to form the p-type semiconductor layer 53. After that, the wafer was annealed at 700° C. in nitrogen atmosphere for further lowering a resistance of the p-type semiconductor layer 53.

The p-electrode 30, 400 nm thick has a layer structure of Ag/Ni/Ti/Pt in this order from the semiconductor stack 50. The passivation film 40, 400 nm thick was made of $SiO_2$. The metallization layer 21 on the epitaxial layer side has a thickness of 1400 nm, and Ti/Pt/Au/Sn/Au were grown in this order from the bottom in FIG. 8D. The metallization layer 22 on the substrate side has a thickness of 653 nm, and Au/Pt/$TiSi_2$ or $TiSi_2$/Pt/Pd were grown in this order. A depth D of the concave 90 formed on the n-type semiconductor layer 51 using, for example, photolithography and dry-etching was 2500 nm. The micro irregularities 95 having a surface roughness of 30 nm were formed by immersing the wafer into TMAH. The n-electrode 60, 1300 nm thick has a layer structure of Ti/Pt/Au in this order from the upper side of the n-type semiconductor layer 51. The passivation layer 70, 400 nm thick was made of $SiO_2$. The backside metallization layer 80 has a thickness of 753 nm, and $TiSi_2$/Pt/Au were grown in this order on the substrate 10. The semiconductor light emitting device 1 configured as described above shows the light distribution indicated with solid line in FIG. 7.

INDUSTRIAL APPLICABILITY

A semiconductor light emitting device according to the present invention can be utilized in various fields, for example, lighting, exposure, display, various kinds of analysis and optical network.

What is claimed is:

1. A semiconductor light emitting device comprising:

a substrate;

a semiconductor stack including a p-type semiconductor layer, a light emitting layer, and an n-type semiconductor layer in this order above the substrate;

a first passivation film comprising an insulating material and disposed on at least a part of the semiconductor stack;

a metallization layer disposed between the substrate and the first passivation film;

a second passivation film comprising an insulating material and disposed between the p-type semiconductor layer and the metallization layer;

a plurality of n-electrodes disposed on the n-type semiconductor layer; and a p-electrode disposed between the p-type semiconductor layer and the metallization layer, wherein the n-type semiconductor layer defines at least one recess and has a light extraction surface defining an opening of the recess, wherein the recess has two slopes, the two slopes having different slope angles in a direction along which a diameter of the recess becomes narrower toward a bottom of the recess from the opening of the recess, wherein the two slopes include a first slope and a second slope, the first slope having a slope angle gentler than a slope angle of the second slope, and a surface of the second slope being less irregular than a surface of the first slope, wherein the first passivation film, continuously covers the recess and lateral surfaces of the semiconductor stack, and wherein, in a cross-sectional view, portions of the second passivation film are disposed alternately with portions of the p-electrode.

2. The semiconductor light emitting device according to claim 1, wherein the first slope of the recess is closer to the opening of the recess than the second slope.

3. The semiconductor light emitting device according to claim 1, wherein the recess has a bottom surface at the bottom and the bottom surface is provided with irregularities.

4. The semiconductor light emitting device according to claim 1, wherein a plurality of the recesses are disposed on the light extraction surface, wherein adjacent openings of the plurality of the recesses are separated from each other by a separating area, and wherein the separating area is provided with irregularities.

5. The semiconductor light emitting device according to claim 1, wherein the plurality of n-electrodes are disposed on the light extraction surface.

6. The semiconductor light emitting device according to claim 1, wherein a shape of the opening of the recess is a circle in plan view from the light extraction surface.

7. The semiconductor light emitting device according to claim 1, wherein a shape of the opening of the recess is a polygon in plan view from the light extraction surface.

8. The semiconductor light emitting device according to claim 1, wherein a shape of the opening of the recess is a hexagon in plan view from the light extraction surface.

9. The semiconductor light emitting device according to claim 1, wherein at least one of the first slope and the second slope of the recess is covered with the first passivation film.

10. The semiconductor light emitting device according to claim 1, wherein the recess is disposed at a position facing the p-electrode.

11. The semiconductor light emitting device according to claim 4, wherein the first slope of each of the recesses is closer to the opening of each of the recesses than the second slope.

12. The semiconductor light emitting device according to claim 4, wherein each of the recesses has a bottom surface at the bottom and the bottom surface is provided with irregularities.

13. The semiconductor light emitting device according to claim 4, wherein the plurality of n-electrodes are disposed on the light extraction surface.

14. The semiconductor light emitting device according to claim 4, wherein a shape of the opening of each of the recesses is a circle in plan view from the light extraction surface.

15. A semiconductor light emitting device comprising:

a substrate;

a semiconductor stack including a p-type semiconductor layer, a light emitting layer, and an n-type semiconductor layer in this order above the substrate, the n-type semiconductor layer defines recesses and has a light extraction surface that defines an opening of each of the recesses; and an n-electrode disposed on the light extraction surface in a region between openings of adjacent two of the recesses, wherein each of the recesses is defined by a bottom surface and two slopes, each of the two slopes having a different slope angle in a direction along which a diameter of each of the recesses becomes narrower toward the bottom surface from the opening, wherein the two slopes include a first slope and a second slope, the first slope having a slope angle gentler than the second slope, and a surface of the second slope being less irregular than a surface of the first slope, wherein a depth of each of the recesses has a length not less than a half of a thickness between the light extraction surface and the light emitting layer and less than the thickness between the light extraction surface and the light emitting layer, and wherein irregularities are provided on a portion of the light extraction surface, and the n-electrode is disposed on the micro irregularities.

16. The semiconductor light emitting device according to claim 15, wherein the first slope of each of the recesses is closer to the opening of the respective recess than the second slope.

17. The semiconductor light emitting device according to claim 15, wherein the bottom surface is provided with irregularities.

18. The semiconductor light emitting device according to claim 15, wherein a shape of the opening of each of the recesses is a circle in plan view from the light extraction surface.

19. The semiconductor light emitting device according to claim 15, wherein the semiconductor stack has a higher planar portion outside the recesses and a lower planar portion inside the recesses, and wherein the two slopes connect the higher planar portion and the lower planar portion.

20. The semiconductor light emitting device according to claim 15, wherein the recesses are exposed to an outside of the semiconductor light emitting device.

21. The semiconductor light emitting device according to claim 19, wherein the plurality of the recesses are disposed on the light extraction surface, wherein adjacent openings of the plurality of the recesses are separated from each other, wherein a separating area which separates the adjacent openings is provided with irregularities, and wherein the separating area comprises the higher planar portion.

22. A semiconductor light emitting device comprising:

a substrate;

a semiconductor stack including a p-type semiconductor layer, a light emitting layer, and an n-type semiconductor layer in this order above the substrate, wherein the n-type semiconductor layer defines a plurality of recesses and has a light extraction surface that defines an opening of each of the recesses;

a plurality of n-electrodes disposed on the light extraction surface, wherein each of the plurality of n-electrodes is disposed in a region between openings of adjacent two of the plurality of recesses, wherein each of the plurality of recesses includes a bottom surface and a sloped surface;

a first passivation film comprising an insulating material and disposed on at least a part of the semiconductor stack;

a metallization layer disposed between the substrate and the first passivation film;

a second passivation film comprising an insulating material and disposed between the p-type semiconductor layer and the metallization layer; and a p-electrode disposed between the p-type semiconductor layer and the metallization layer, wherein a diameter of each of the plurality of recesses becomes narrower toward the bottom surface from the opening, wherein the bottom surface of each of the recesses and the region between the openings of the plurality of recesses have irregularities, and wherein the plurality of recesses are located from an outermost side of each of the plurality of n-electrodes to lateral surfaces of the semiconductor stack in a cross-sectional side view of the semiconductor light emitting device.

23. The semiconductor light emitting device according to claim 22, wherein the first passivation film is arranged on the light extraction surface so as to cover the recesses.

24. The semiconductor light emitting device according to claim 22, wherein a shape of the opening of each of the recesses is a circle in plan view from the light extraction surface.

25. The semiconductor light emitting device according to claim 22, wherein a shape of the opening of each of the recesses is a polygon in plan view from the light extraction surface.

26. The semiconductor light emitting device according to claim 22, wherein a shape of the opening of each of the recesses is a hexagon in plan view from the light extraction surface.

27. The semiconductor light emitting device according to claim 22, wherein a depth of the recesses has a length not less than half of a thickness between the light extraction surface and the light emitting layer and less than the thickness between the light extraction surface and the light emitting layer.

* * * * *